(12) United States Patent
Koyama

(10) Patent No.: US 7,298,355 B2
(45) Date of Patent: Nov. 20, 2007

(54) DISPLAY DEVICE

(75) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 702 days.

(21) Appl. No.: 10/735,048

(22) Filed: Dec. 15, 2003

(65) Prior Publication Data
US 2004/0124442 A1 Jul. 1, 2004

(30) Foreign Application Priority Data
Dec. 27, 2002 (JP) ............................. 2002-378868

(51) Int. Cl.
G09G 3/36 (2006.01)
(52) U.S. Cl. ........................ 345/92; 345/87; 345/98
(58) Field of Classification Search ................ 345/87, 345/92, 96, 98, 99, 100
See application file for complete search history.

(56) References Cited

U.S. PATENT DOCUMENTS

| | | | |
|---|---|---|---|
| 5,349,366 A | | 9/1994 | Yamazaki et al. |
| 5,712,652 A | | 1/1998 | Sato et al. |
| 6,166,792 A | * | 12/2000 | Miyawaki et al. .......... 349/113 |
| 2001/0007447 A1 | * | 7/2001 | Tanaka et al. ................ 345/87 |
| 2001/0038555 A1 | | 11/2001 | Kato |
| 2002/0113268 A1 | | 8/2002 | Koyama et al. |
| 2002/0175888 A1 | * | 11/2002 | Murade ....................... 345/92 |
| 2002/0175907 A1 | * | 11/2002 | Sekiya et al. ............... 345/211 |

FOREIGN PATENT DOCUMENTS

JP 08-286170 11/1996

* cited by examiner

*Primary Examiner*—Richard Hjerpe
*Assistant Examiner*—Kimnhung Nguyen
(74) *Attorney, Agent, or Firm*—Nixon Peabody LLP; Jeffrey Costellia

(57) ABSTRACT

In an active matrix display device using an SRAM, the number of transistors configuring the SRAM circuit is large. Therefore, the transistors cannot be embedded in a pixel when a pixel area is small, otherwise an aperture ratio is reduced. In view of the foregoing, it is an object of the present invention to provide a display device without a refreshing operation and thus with small power consumption. According to the invention, a display device including a pixel which comprises a switching element and a nonvolatile memory element is provided. When a still image is displayed by utilizing a ferroelectric element as a nonvolatile memory element and storing a signal, writing is not required per frame. Further, as the ferroelectric element occupies a small area, a memory circuit can be incorporated without decreasing an aperture ratio.

20 Claims, 19 Drawing Sheets

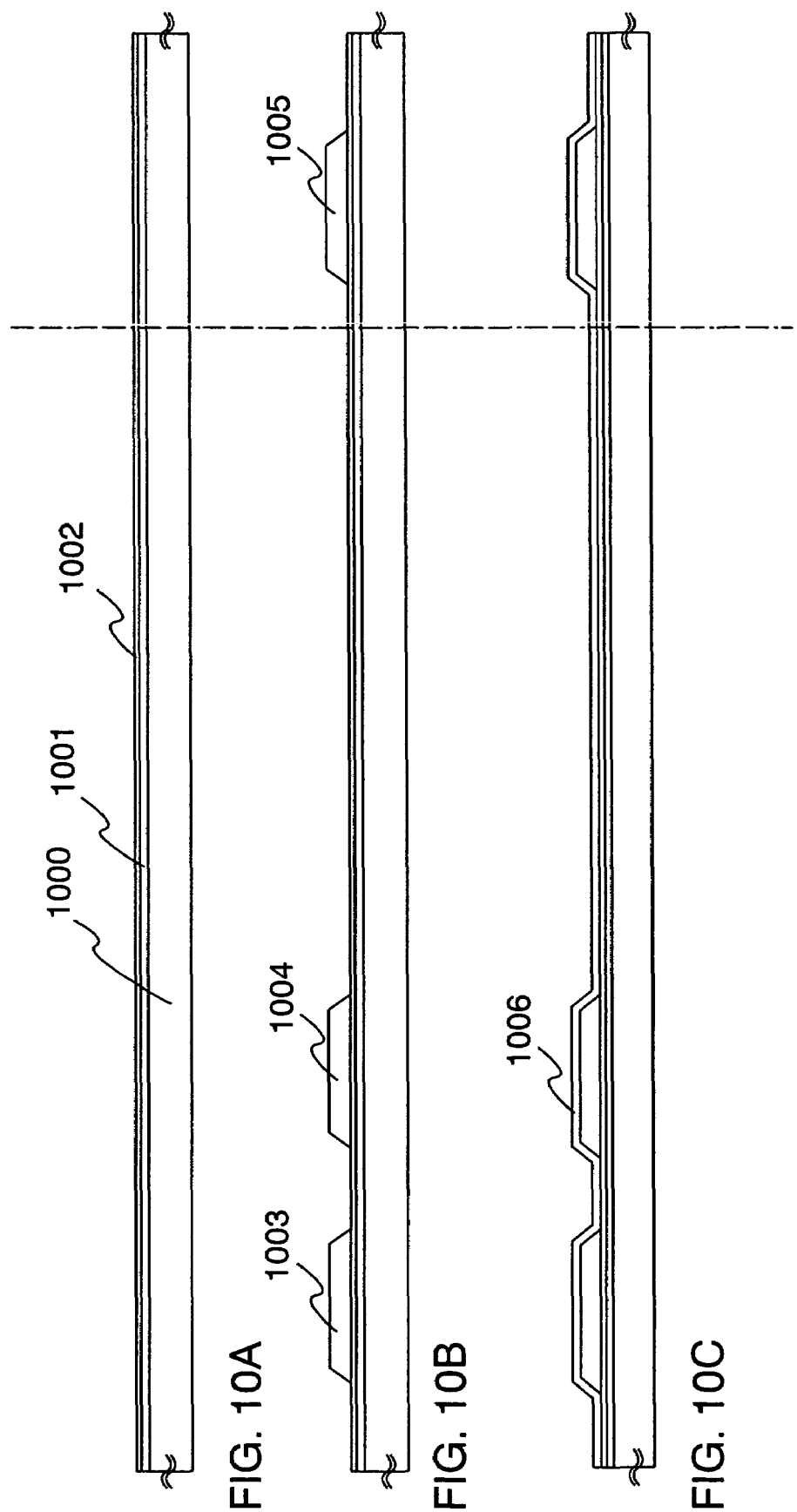

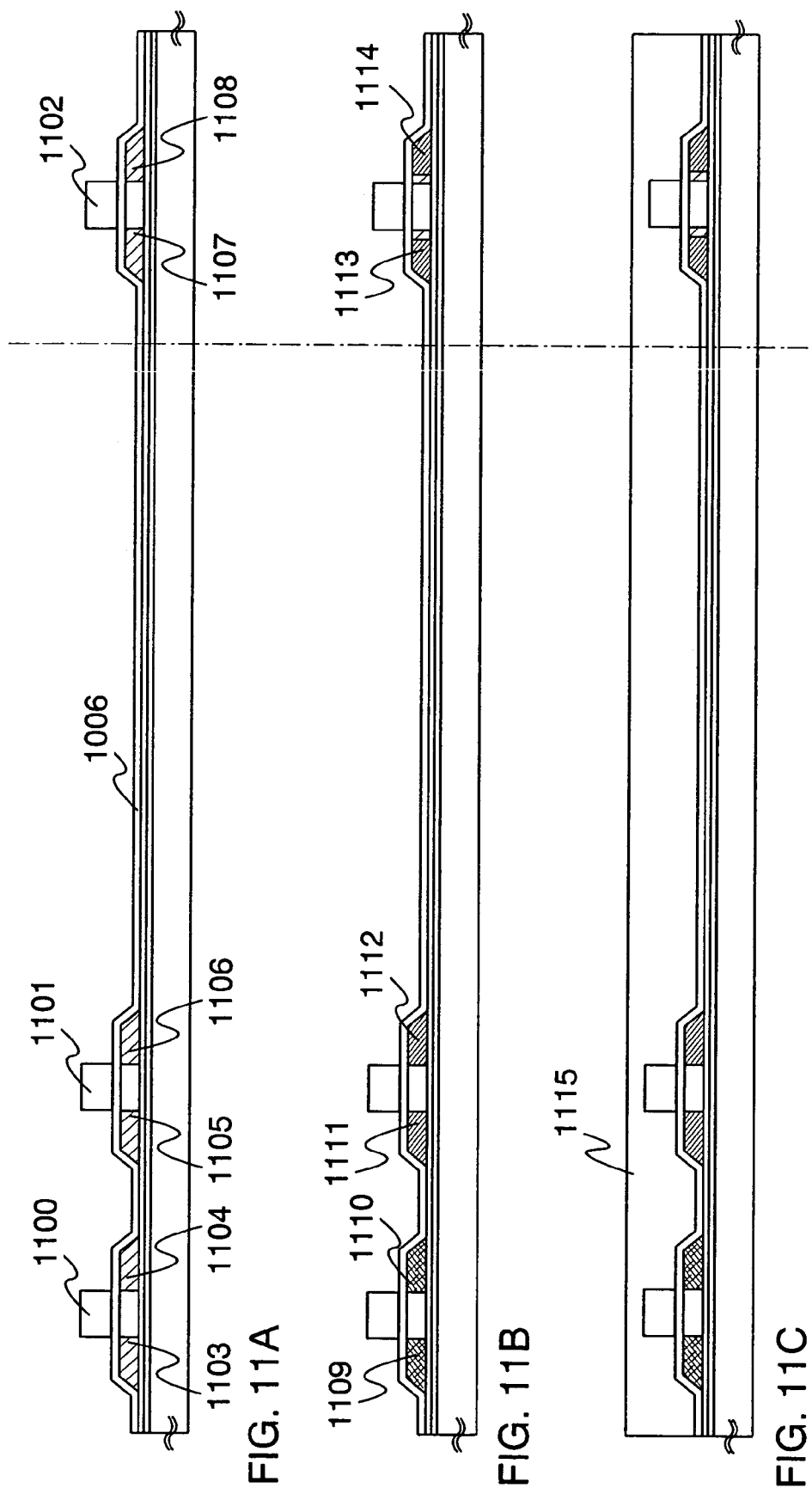

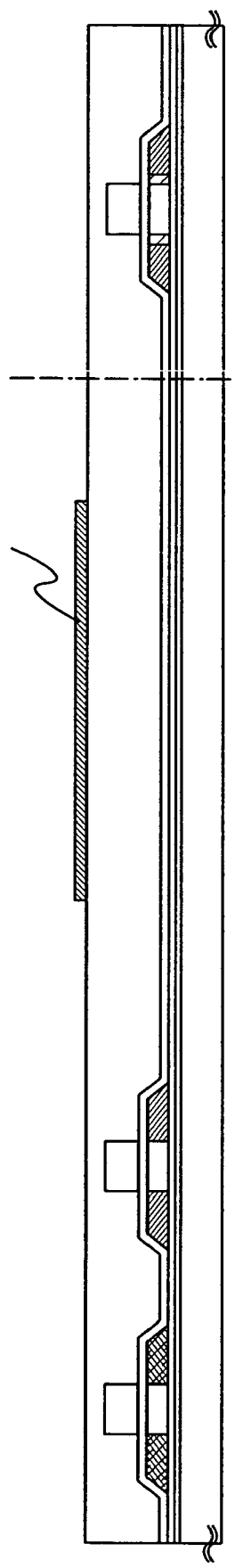
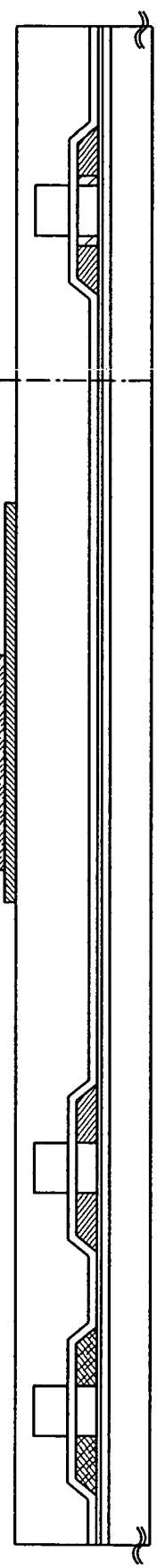
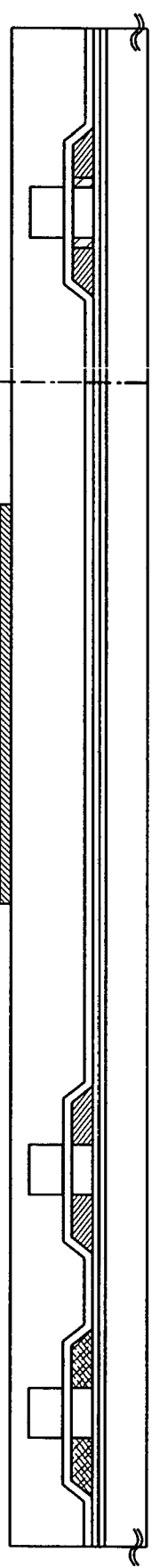
FIG. 12A
FIG. 12B
FIG. 12C

DISPLAY DEVICE

BACKGROUND OF THE INVENTION

1. Field of the Invention

The present invention relates to a display device, and more particularly to a display device using a thin film transistor (TFT) formed on a transparent substrate such as glass or plastics, and a driving method of the same. In addition, the invention relates to electronic apparatuses using the display device.

2. Description of the Related Art

In recent years, with the advance of the communication technology, mobile phones have been widely used. In future, transmission of moving images and a larger volume of information are expected. On the other hand, through reduction in weight of personal computers, those adapted for mobile communication have been produced. Information terminals called PDA originated in electronic notebooks have also been produced in large quantities and widely used. In addition, with the development of display devices, the majority of portable information devices are equipped with a flat panel display.

Moreover, according to recent techniques, an active matrix display device tends to be used as a display device for the above portable information device and the like. In the active matrix display device, a TFT is arranged in each pixel and a display screen is controlled by the TFT. Compared to a passive matrix display device, such an active matrix display device has advantages in that it achieves high performance and high image quality, and can handle moving images. Therefore, it is expected that the mainstream of liquid crystal display devices will also shift from passive matrix types to active matrix types.

An active matrix display device has been manufactured using a polycrystalline semiconductor such as polysilicon formed at a temperature of 500° C. or less at highest, which is rather low as compared to the conventional condition of 1000° C. or more. Such an active matrix display device has advantages in that, in addition to a pixel, a driver circuit can be integrally formed around a pixel portion, which makes it possible to realize downsizing and high definition of a display device. Thus, such a display device is expected to be more widely used in future.

A description is given below on the operation of a pixel portion in an active matrix liquid crystal display device. FIG. 2 shows a configuration example of an active matrix liquid crystal display device. One pixel 220 comprises a source signal line 203, a gate signal line 205, a capacitor line 219, a pixel TFT 207, a storage capacitor 211, and a liquid crystal 215. However, the capacitor line may not necessarily be provided if other wiring and the like can concurrently serve as the capacitor line. A gate electrode of the pixel TFT 207 is connected to the gate signal line 205. Further, either of a drain region or a source region of the pixel TFT 207 is connected to the source signal line 203 whereas the other is connected to the storage capacitor 211 and the liquid crystal 215.

The gate signal line 205 and a gate signal line 206 are selected sequentially in accordance with a line cycle. Provided that the pixel TFT 207 and a pixel TFT 209 are N-channel types, the gate signal line 205 becomes active when it is Hi, thus the pixel TFTs 207 and 209 are turned ON. As the pixel TFTs 207 and 209 are turned ON, potentials of the source signal line 203 and a source signal line 204 are respectively written into the storage capacitor 211 and a storage capacitor 213 and into the liquid crystal 215 and a liquid crystal 217. In the next line period, the adjacent gate signal line 206 becomes active and potentials of pixel TFTs 208 and 210 become Hi. Then, the potentials of the source signal lines 203 and 204 are respectively written into storage capacitors 212 and 214 and into liquid crystals 216 and 218 in a similar fashion. The liquid crystals 215 to 218 are aligned in accordance with the written potentials and change light transmissivity. In this manner, the active matrix liquid crystal display performs a display operation using a liquid crystal as a light shutter.

Also, as shown in FIG. 14, an active matrix display device which performs a display operation with a static RAM (SRAM) inside its pixel portion and is also developed. (See Patent Document 1).

[Patent Document 1] Japanese Patent Application Laid-open No. Hei8-286170

In FIG. 14, one pixel 1407 comprises an SRAM 1403, switches 1405 and 1406, and a liquid crystal 1404. A source signal line driver circuit 1401 outputs an video signal to source signal lines 1408 and 1409. When a gate signal line 1410 is selected by a gate signal line driver circuit 1402, the video signal is written into the SRAM 1403 via the source signal lines 1408 and 1409. Either of the switches 1405 and 1406 operates based on the stored signal in the SRAM 1403 and either a potential Va or Vb is applied to the liquid crystal 1404. This signal is maintained until the next video signal is written into the SRAM 1403. In this manner, a display operation is performed.

SUMMARY OF THE INVENTION

Conventional active matrix display devices suffer from problems in that its display portion has a dynamic RAM (DRAM) structure with a storage capacitor and a switching circuit as described above, thus a periodical refreshing operation is required. Operation waveforms thereof are shown in FIG. 3. A pixel signal line waveform approaches a source signal line waveform at the point when the source signal line waveform changes at t1 and t4.

In the conventional example shown in FIG. 3, a display operation can be performed favorably since the rewriting is performed at t2 to t3 and t5 to t6. However, when a refreshing operation is not performed or a refreshing period is long, a charge accumulated in the storage capacitor is discharged due to a leakage current of a switching TFT and thus a voltage required for driving the liquid crystal can not be stored. Therefore, even in the case of displaying an image such as a still image where an image data does not essentially change, periodical writing is required. As a result, power consumption is increased.

Meanwhile, as for an active matrix display device using an SRAM as shown in FIG. 14, the number of transistors configuring the SRAM circuit is large. Therefore, the transistors cannot be embedded in pixels when a pixel area is small, or otherwise an aperture ratio is reduced.

To solve the foregoing problems, the following method is applied to the display device of the invention. That is, a nonvolatile memory element such as one utilizing a ferroelectric material is provided in a pixel portion so that stored data is saved in the nonvolatile memory element without refreshing. By utilizing the ferroelectric material, an SRAM can be omitted, thus an element area occupying each pixel area can be reduced.

A display device according to the invention comprises a source signal line, a gate signal line, and a pixel, all of which are arranged in matrix. One pixel comprises a switching element, a nonvolatile memory element, and a pixel electrode. An input terminal of the switching element is electrically connected to the source signal line, an output terminal thereof is electrically connected to the nonvolatile memory element and the pixel electrode, and a control terminal thereof is electrically connected to the gate signal line.

A display device according to the invention comprises a plurality of source signal lines, a plurality of gate signal lines, and a plurality of pixels, all of which are arranged in matrix. One pixel comprises a plurality of sub-pixels each comprising a switching element, a nonvolatile memory element, and a pixel electrode. An input terminal of the switching element is electrically connected to the source signal line, an output terminal thereof is electrically connected to the nonvolatile memory element and the pixel electrode, and a control terminal thereof is electrically connected to the gate signal line.

A display device according to the invention comprises a plurality of source signal lines, a plurality of gate signal lines, and a plurality of pixels, all of which are arranged in matrix. One pixel comprises a plurality of sub-pixels each comprising a switching element, a nonvolatile memory element, and a pixel electrode. An input terminal of the switching element is electrically connected to the source signal line, an output terminal thereof is electrically connected to the nonvolatile memory element and the pixel electrode, and a control terminal thereof is electrically connected to the gate signal line. Incidentally, each switching element in one pixel is connected to the different source signal line.

A display device according to the invention comprises a plurality of source signal lines, a plurality of gate signal lines, and a plurality of pixels, all of which are arranged in matrix. N lines of the source signal lines are provided corresponding to one pixel column, and one pixel comprises n pieces of sub-pixels each comprising a switching element, a nonvolatile memory element, and a pixel electrode. An input terminal of the switching element is electrically connected to the source signal line, an output terminal thereof is electrically connected to the nonvolatile memory element and the pixel electrode, and a control terminal thereof is electrically connected to the gate signal line. Incidentally, each switching element in one pixel is connected to any one of the n lines of the source signal lines.

A display device according to the invention comprises a plurality of source signal lines, a plurality of gate signal lines, and a plurality of pixels, all of which are arranged in matrix. One pixel comprises a plurality of sub-pixels each comprising a switching element, a nonvolatile memory element, and a pixel electrode. An input terminal of the switching element is electrically connected to the source signal line, an output terminal thereof is electrically connected to the nonvolatile memory element and the pixel electrode, and a control terminal thereof is electrically connected to the gate signal line. Incidentally, each switching element in one pixel is connected to the different gate signal line.

A display device according to the invention comprises a plurality of source signal lines, a plurality of gate signal lines, and a plurality of pixels, all of which are arranged in matrix. N lines of the gate signal lines are provided corresponding to one pixel column, and one pixel comprises n pieces of sub-pixels each comprising a switching element, a nonvolatile memory element, and a pixel electrode. An input terminal of the switching element is electrically connected to the source signal line, an output terminal thereof is electrically connected to the nonvolatile memory element and the pixel electrode, and a control terminal thereof is electrically connected to the gate signal line. Incidentally, each switching element in one pixel is connected to any one of the n lines of the gate signal lines.

A display device according to the invention comprises a source signal line, a gate signal line, and a pixel, all of which are arranged in matrix, and the pixel comprises a switching element, a nonvolatile memory element, a driver element, and a pixel electrode. An input terminal of the switching element is electrically connected to the source signal line, an output terminal thereof is electrically connected to the nonvolatile memory element and the driver element, a control terminal thereof is electrically connected to the gate signal line, and the driver element is electrically connected to the pixel electrode.

A display device according to the invention comprises a plurality of source signal lines, a plurality of gate signal lines, and a plurality of pixels, all of which are arranged in matrix. One pixel comprises a plurality of sub-pixels each comprising a switching element, a nonvolatile memory element, a driver element, and a pixel electrode. An input terminal of the switching element is electrically connected to the source signal line, an output terminal thereof is electrically connected to the nonvolatile memory element and the driver element, a control terminal thereof is electrically connected to the gate signal line, and the driver element is electrically connected to the pixel electrode.

A display device according to the invention comprises a plurality of source signal lines, a plurality of gate signal lines, and a plurality of pixels, all of which are arranged in matrix. One pixel comprises a plurality of sub-pixels each comprising a switching element, a nonvolatile memory element, a driver element, and a pixel electrode. An input terminal of the switching element is electrically connected to the source signal line, an output terminal thereof is electrically connected to the nonvolatile memory element and the driver element, a control terminal thereof is electrically connected to the gate signal line, and the driver element is electrically connected to the pixel electrode. Incidentally, each switching element in one pixel is connected to the different source signal line.

A display device according to the invention comprises a plurality of source signal lines, a plurality of gate signal lines, and a plurality of pixels, all of which are arranged in matrix. N lines of the source signal lines are provided corresponding to one pixel column, and one pixel comprises n pieces of sub-pixels each comprising a switching element, a nonvolatile memory element, a driver element, and a pixel electrode. An input terminal of the switching element is electrically connected to the source signal line, an output terminal thereof is electrically connected to the nonvolatile memory element and the driver element, a control terminal thereof is electrically connected to the gate signal line, and the driver element is electrically connected to the pixel electrode. Incidentally, each switching element in one pixel is connected to any one of the n lines of the gate signal lines.

A display device according to the invention comprises a plurality of source signal lines, a plurality of gate signal lines, and a plurality of pixels, all of which are arranged in matrix. One pixel comprises a plurality of sub-pixels each comprising a switching element, a nonvolatile memory element, a driver element, and a pixel electrode. An input terminal of the switching element is electrically connected to the source signal line, an output terminal thereof is electrically connected to the nonvolatile memory element and the driver element, a control terminal thereof is electrically connected to the gate signal line, and the driver element is electrically connected to the pixel electrode. Incidentally, each switching element in one pixel is connected to the different gate signal line.

A display device according to the invention comprises a plurality of source signal lines, a plurality of gate signal lines, and a plurality of pixels, all of which are arranged in matrix. N lines of the gate signal lines are provided corresponding to one pixel column, and one pixel comprises n pieces of sub-pixels each comprising a switching element, a nonvolatile memory element, a driver element, and a pixel electrode. An input terminal of the switching element is electrically connected to the source signal line, an output terminal thereof is electrically connected to the nonvolatile memory element and driver element, a control terminal thereof is electrically connected to the gate signal line, and the driver element is electrically connected to the pixel electrode. Incidentally, each switching element in one pixel is connected to any one of the n lines of the gate signal lines.

According to the invention as set forth above, it is desirable that a ferroelectric memory is utilized as a nonvolatile memory element. Also, a thin film transistor may be utilized as a switching element.

Furthermore, according to the invention as set forth above, a source signal line driver circuit and/or a gate signal line driver circuit may be formed on the same substrate as the pixel. Also, the source signal line driver circuit and/or the gate signal line driver circuit may be configured with unipolar transistors.

BRIEF DESCRIPTION OF THE DRAWINGS

FIGS. 10A to 10C are sectional views showing structures of the invention.

FIGS. 11A to 11C are sectional views showing structures of the invention.

FIGS. 12A to 12C are sectional views showing structures of the invention.

DESCRIPTION OF THE PREFERRED EMBODIMENTS

Preferred embodiments of the invention will be hereinafter described referring to the accompanying drawings.

Embodiment Mode

Figure 1:
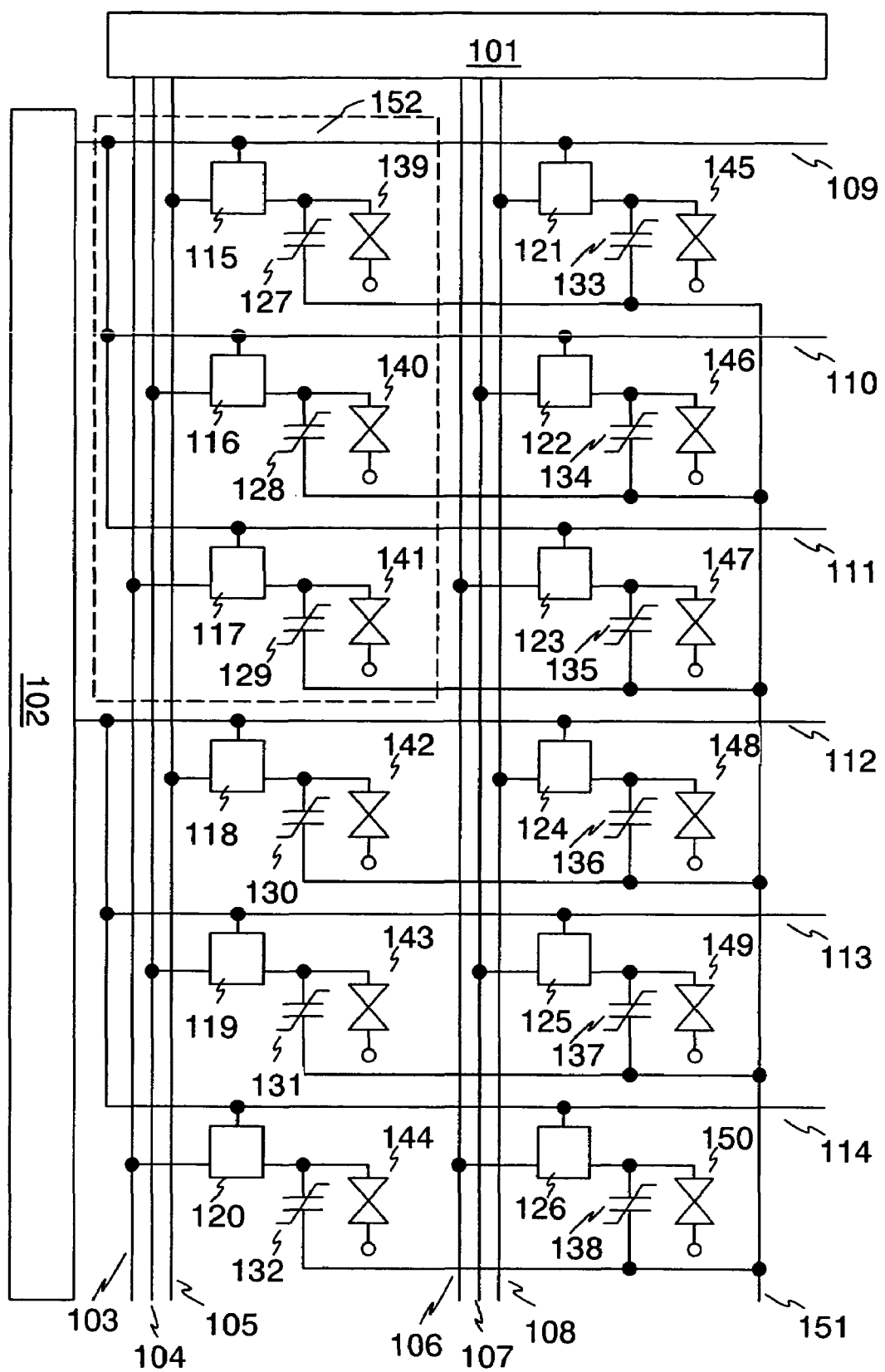
FIG. 1 is a configuration diagram of a display device of the invention.
Figure 2:
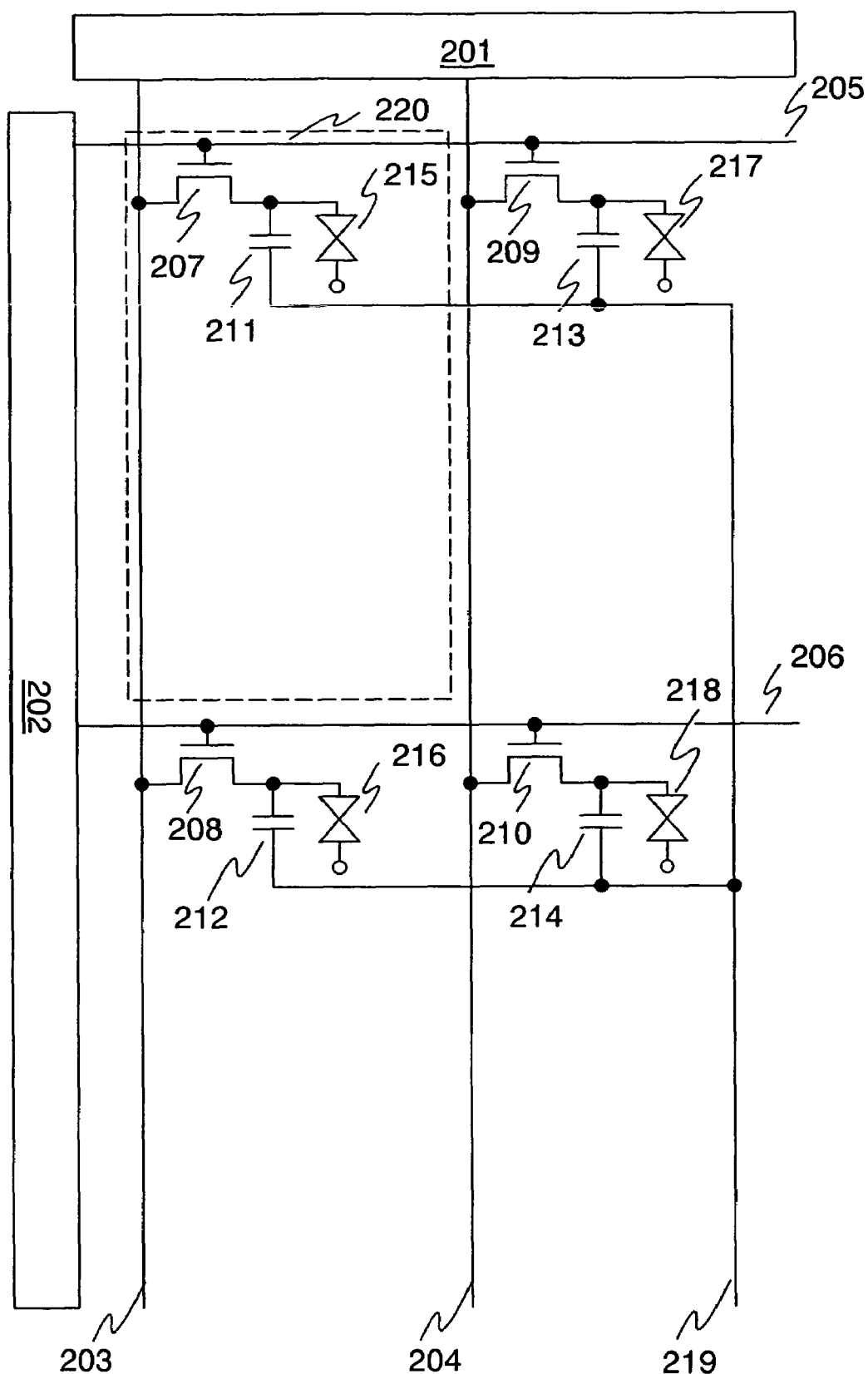
FIG. 2 is a configuration diagram a of a conventional display device.
Figure 3:
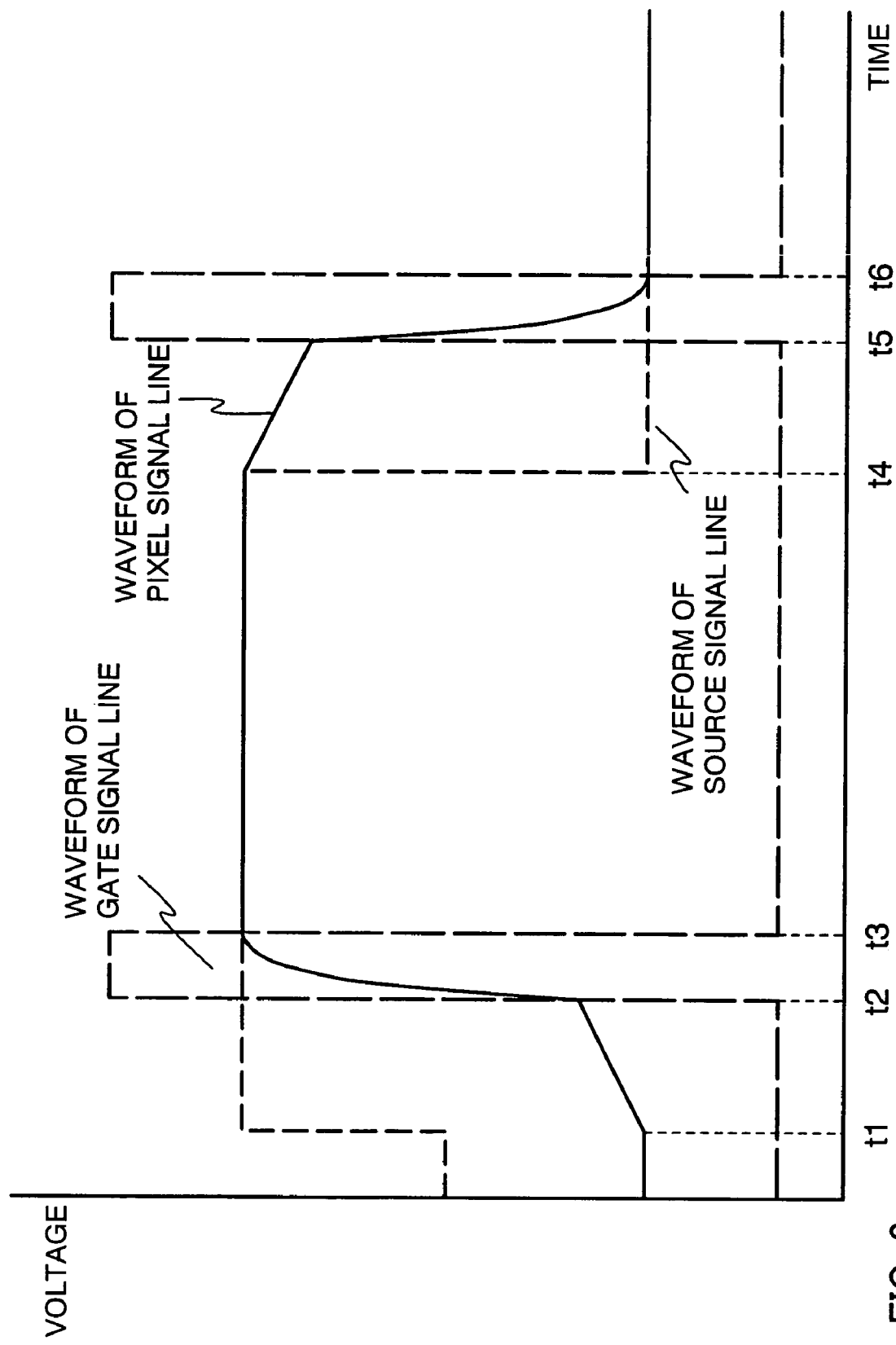
FIG. 3 is a diagram showing operation waveforms of a pixel portion of a conventional display device.

Shown in FIG. 1 is a configuration of the invention. Note that, a 3-bit gradation is taken as an example in FIG. 1, however, the invention is not exclusively limited to 3-bit. One pixel 152 comprises three switching elements and three nonvolatile memory elements. ON/OFF operations of the switching elements are controlled by gate signal lines. One terminal of each nonvolatile memory element is connected to each switching element and the other terminal thereof is connected to a common electrode 151. Each switching element has an input terminal, an output terminal, and a control terminal, wherein the input terminal is electrically connected to a source signal line, the output terminal is electrically connected to the nonvolatile memory element and to a liquid crystal element via and a pixel electrode (not shown in the figure), and the control terminal is electrically connected to the gate signal line. Operation thereof is explained below.

Digital video signals are outputted from a source signal line driver circuit 101 to source signal lines 103 to 108. When gate signal lines 109 to 111 are selected by a gate signal line driver circuit 102, switching elements 115 to 117 and 121 to 123 are turned ON and the digital video signals from the source signal lines 103 to 108 are written into nonvolatile memory elements 127 to 129 and 133 to 135. When the selection of the gate signal lines 109 to 111 are released by the gate signal line driver circuit 102, the switching elements 115 to 117 and 121 to 123 are turned OFF. However, as the signals are stored in the nonvolatile memory elements 127 to 129 and 133 to 135, liquid crystals 139 to 141 and 145 to 147 can perform a display operation based on the stored signals.

Next, when gate signal lines 112 to 114 are selected by the gate signal line driver circuit 102, switching elements 118 to 120 and 124 to 126 are turned ON and the digital video signals from the source signal lines 103 to 108 are written into nonvolatile memory elements 130 to 132 and 136 to 138. When the selection of the gate signal lines 112 to 114 are released by the gate signal line driver circuit 102, the switching elements 118 to 120 and 124 to 126 are turned OFF. However, as the signals are stored in the nonvolatile memory elements 130 to 132 and 136 to 138, liquid crystals 142 to 144 and 148 to 150 can perform a display operation based on the stored signals.

According to the invention, a display operation is performed with an area gradation system since signals are stored digitally. That is, when a 3-bit display operation is to be performed, a gradation can be expressed by setting an area ratio of the pixel electrodes at 4:2:1, and storing a necessary signal according to a required gradation.

When a ferroelectric material such as PZT (lead zirconate titanate: $Pb[Zr_x, Ti_{1-x}]O_3$) is utilized for the nonvolatile memory element, the signal can be stored even when the power source is turned OFF. Therefore, when a still image is displayed, the power source of the display device can be turned OFF and the electricity can thus be reduced. In this manner, a refreshing operation which has been the conventional problem can be omitted and the power consumption can be reduced. The ferroelectric material is not exclusively limited to PZT and other materials can be utilized as well.

Also, according to the invention, unlike a display device using an SRAM, a large number of transistors are not required inside a pixel. Therefore, it can be driven without causing such problems as a case where the transistors cannot be embedded in the pixel when a pixel area is small or where an aperture ratio is notably reduced. Incidentally, a material such as an electrophoresis element can be utilized instead of a liquid crystal although the liquid crystal has been taken as an example above.

Further, the source signal line driver circuit, the gate signal line driver circuit, or other circuits used in the invention can be integrally formed on the same substrate as the pixels, while they can be formed on the separate substrates using the techniques of COG (Chip On Glass) or TAB (Tape Automated Bonding) and the like.

Embodiment 1

Figure 4:
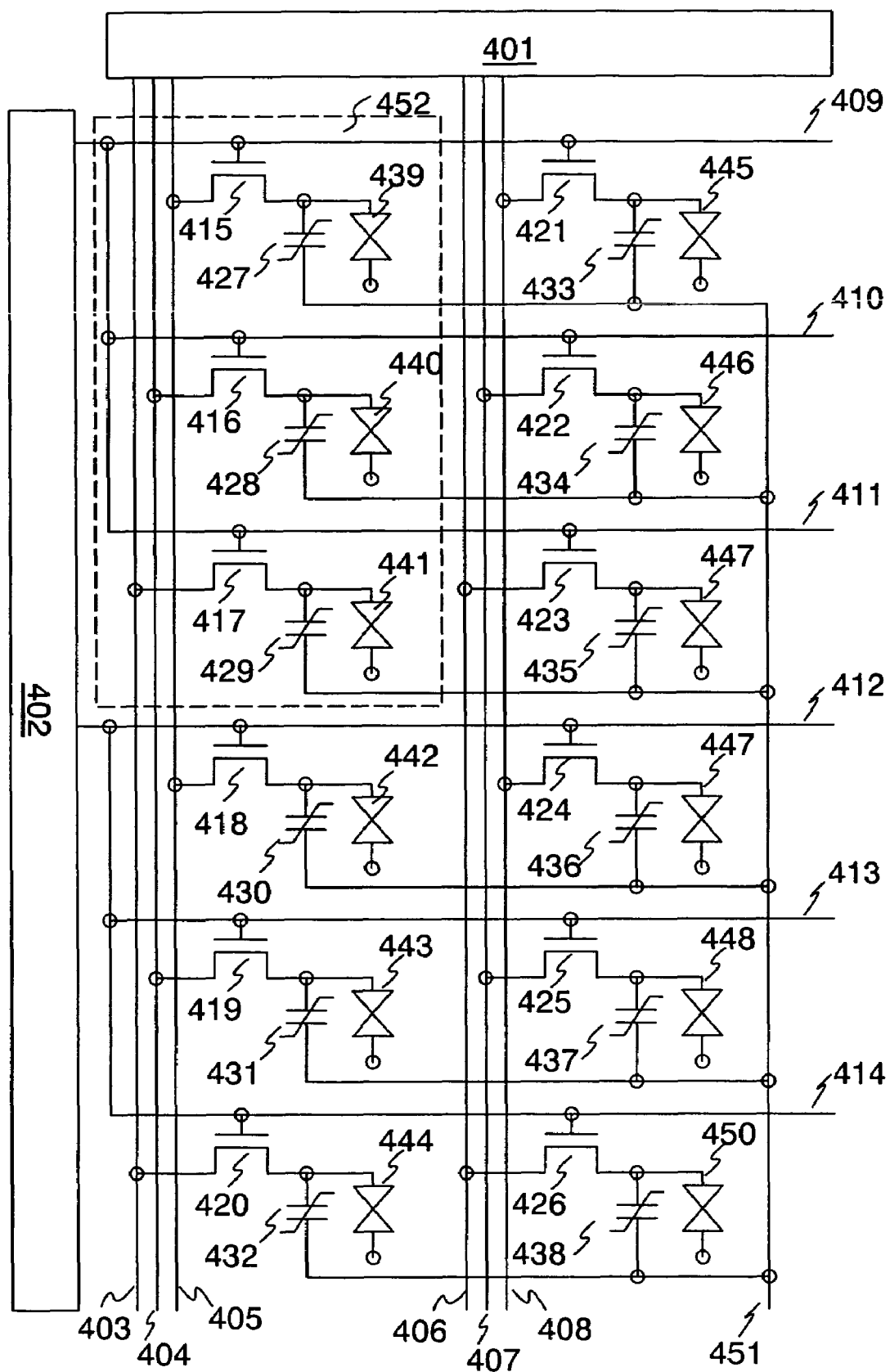
FIG. 4 is a configuration diagram of an embodiment of a display device of the invention.

Shown in FIG. 4 is a configuration of an embodiment of the invention. In this embodiment, switching elements are formed of TFTs. Note that, a 3-bit gradation is taken as an example in FIG. 4, however, the invention is not exclusively limited to 3-bit. One pixel 452 comprises three TFTs and three nonvolatile memory elements. ON/OFF operations of the TFTs are controlled by gate signal lines. One terminal of each nonvolatile memory element is connected to each TFT and to each liquid crystal element via a pixel electrode (not shown in the figure), and the other terminal thereof is connected to a common electrode 451. Operation thereof is explained below.

Digital video signals are outputted from a source signal line driver circuit 401 to source signal lines 403 to 408. When gate signal lines 409 to 411 are selected by a gate signal line driver circuit 402, TFTs 415 to 417 and 421 to 423 are turned ON and the digital video signals from the source signal lines 403 to 408 are written into nonvolatile memory elements 427 to 429 and 433 to 435. When the selection of the gate signal lines 409 to 411 are released by the gate signal line driver circuit 402, the TFTs 415 to 417 and 421 to 423 are turned OFF. However, as the signals are stored in the nonvolatile memory elements 427 to 429 and 433 to 435, liquid crystals 439 to 441 and 445 to 447 can perform a display operation based on the stored signals.

Next, when gate signal lines 412 to 414 are selected by the gate signal line driver circuit 402, TFTs 418 to 420 and 424 to 426 are turned ON and the digital video signals from the source signal lines 403 to 408 are written into nonvolatile memory elements 430 to 432 and 436 to 438. When the selection of the gate signal lines 412 to 414 are released by the gate signal line driver circuit 402, the TFTs 418 to 420 and 424 to 426 are turned OFF. However, as the signals are stored in the nonvolatile memory elements 430 to 432 and 436 to 438, liquid crystals 442 to 444 and 448 to 450 can perform a display operation based on the stored signals.

According to the invention, a display operation is performed with an area gradation system since signals are stored out digitally. That is, when a 3-bit display operation is to be performed, a gradation can be expressed by setting an area ratio of the pixel electrodes at 4:2:1, and storing a necessary signal according to a required gradation.

When a ferroelectric material such as PZT is utilized for the nonvolatile memory element, the signal can be stored even when the power source is turned OFF. Therefore, when a still image is displayed, the power source of the display device can be turned OFF and the electricity can thus be reduced. In this manner, a refreshing operation which has been the conventional problem can be omitted and the power consumption can be reduced.

Also, according to the invention, unlike a display device using an SRAM, a large number of transistors are not required inside a pixel. Therefore, it can be driven without causing such problems as a case where the transistors cannot be embedded in the pixel when a pixel area is small or where an aperture ratio is notably reduced.

Embodiment 2

Figure 5:
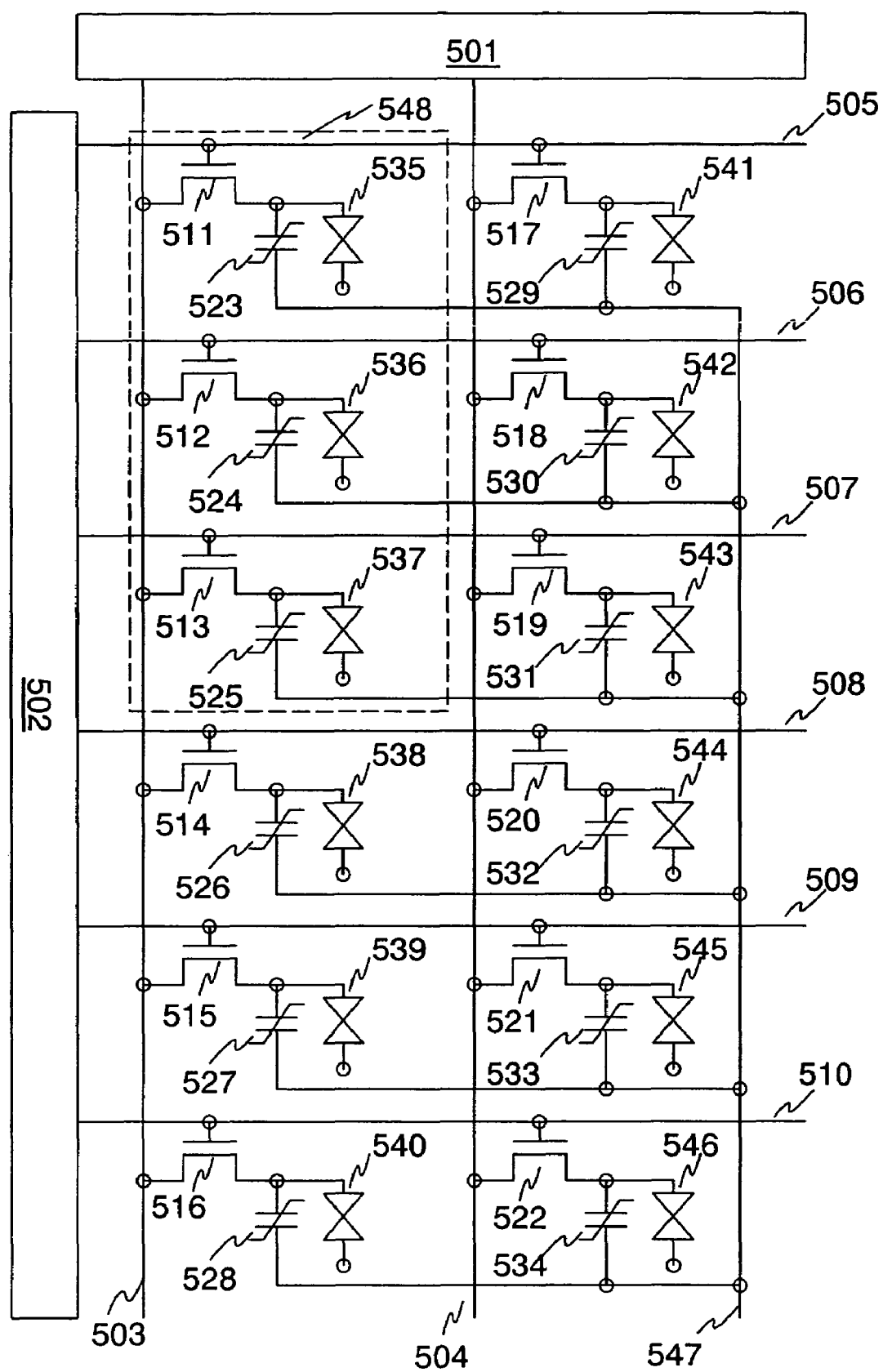
FIG. 5 is a configuration diagram of an embodiment of a display device of the invention.

Shown in FIG. 5 is a configuration of an embodiment of the invention. This embodiment is different from Embodiment 1 in that one source signal line is provided corresponding to one pixel column. Note that, a 3-bit gradation is taken as an example in FIG. 5, however, the invention is not exclusively limited to 3-bit. One pixel 548 comprises three TFTs and three nonvolatile memory elements. ON/OFF operations of the TFTs are controlled by gate signal lines. One terminal of each nonvolatile memory element is connected to each TFT and to each liquid crystal element via a pixel electrode (not shown in the figure), and the other terminal thereof is connected to a common electrode 547. Operation thereof is explained below.

Digital video signals are outputted from a source signal line driver circuit 501 to source signal lines 503 and 504. When a gate signal line 505 is selected by a gate signal line driver circuit 502, TFTs 515 and 517 are turned ON and the digital video signals from the source signal lines 503 and 504 are written into nonvolatile memory elements 523 and 529. When the selection of the gate signal line 505 is released by the gate signal line driver circuit 502, the TFTs 511 and 517 are turned OFF. However, as the signals are stored in the nonvolatile memory elements 523 and 529, liquid crystals 535 and 541 can perform a display operation based on the stored signals.

Next, when a gate signal line 506 is selected by the gate signal line driver circuit 502, TFTs 512 and 518 are turned ON and the digital video signals from the source signal lines 503 and 504 are written into nonvolatile memory elements 524 and 530. When the selection of the gate signal line 506 is released by the gate signal line driver circuit 502, the TFTs 512 and 518 are turned OFF. However, as the signals are stored in the nonvolatile memory elements 524 and 530, liquid crystals 536 and 542 can perform a display operation based on the stored signals.

Next, when a gate signal line 507 is selected by the gate signal line driver circuit 502, TFTs 513 and 519 are turned ON and the digital video signals from the source signal lines 503 and 504 are written into nonvolatile memory elements 525 and 531. When the selection of the gate signal line 507 is released by the gate signal line driver circuit 502, the TFTs 513 and 519 are turned OFF. However, as the signals are stored in the nonvolatile memory elements 525 and 531, liquid crystals 537 and 543 can perform a display operation based on the stored signals. In this manner, data writing of one pixel 548 is completed. The data writing is carried out during one horizontal line period.

In the similar fashion, the above writing operation is carried out in the subsequent pixel row. First, gate signal lines 508, 509, and 510 are sequentially selected. Then, according to the selected gate signal lines, TFTs 514, 520, 515, 521, 516, and 522 are sequentially turned ON and the digital video signals from source signal lines 503 and 504 are written into nonvolatile memory elements 526, 532, 527, 533, 528, and 534. In this manner, a display operation is performed. In this embodiment, as the number of source signal lines can be reduced, it contributes to an improvement of the aperture ratio.

Embodiment 3

Figure 6:
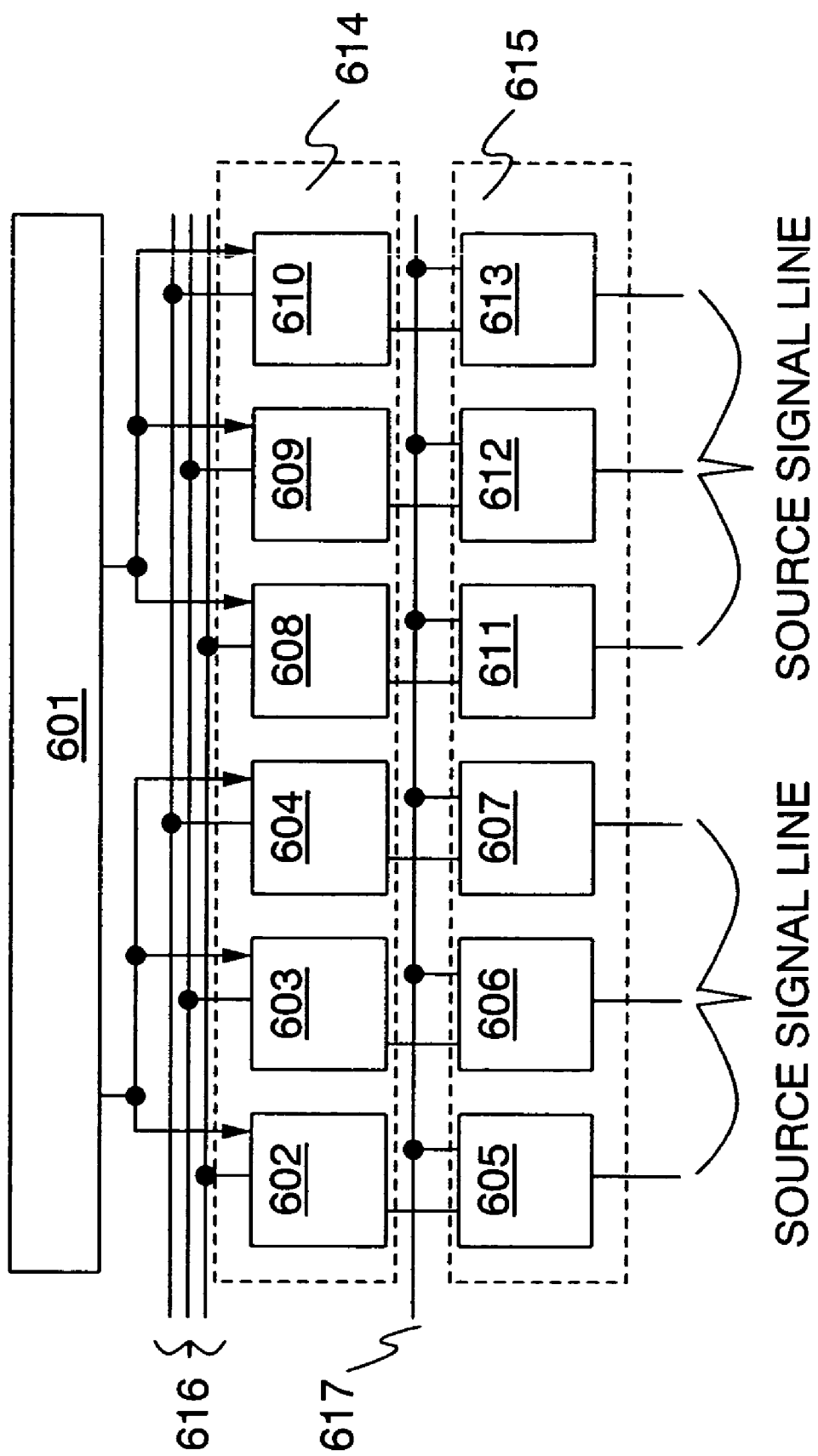
FIG. 6 is a block diagram showing a source signal line driver circuit of a display device t of the invention

Shown in FIG. 6 is an embodiment of a source signal line driver circuit which corresponds to the pixel configuration shown in Embodiment 1. In FIG. 6, the source signal line driver circuit comprises a shift register 601, a 1st latch circuit 614, and a 2nd latch circuit 615. Operation of the source signal line driver circuit is explained below.

When output pulses from the shift register 601 are inputted to latch circuits 602 to 604, digital video signals from a video signal line 616 are stored in the latch circuits 602 to 604. Subsequently, when output pulses from the shift register 601 are inputted to latch circuits 608 to 610, digital video signals from the video signal line 616 are stored in the latch circuits 608 to 610. In this manner, output pulses from the shift register 601 are sequentially scanned and video signals corresponding to one line are stored in the 1st latch circuit 614. Then, before an image of a succeeding line is displayed, latch pulses are inputted to latch circuits 605 to 607 and 611 to 613, and the video signals from the 1st latch circuit 614 are stored in the 2nd latch circuit 615. As a result, the video signals are outputted to source signal lines. In this manner, the source signal line driver circuit is operated.

Embodiment 4

Figure 7:
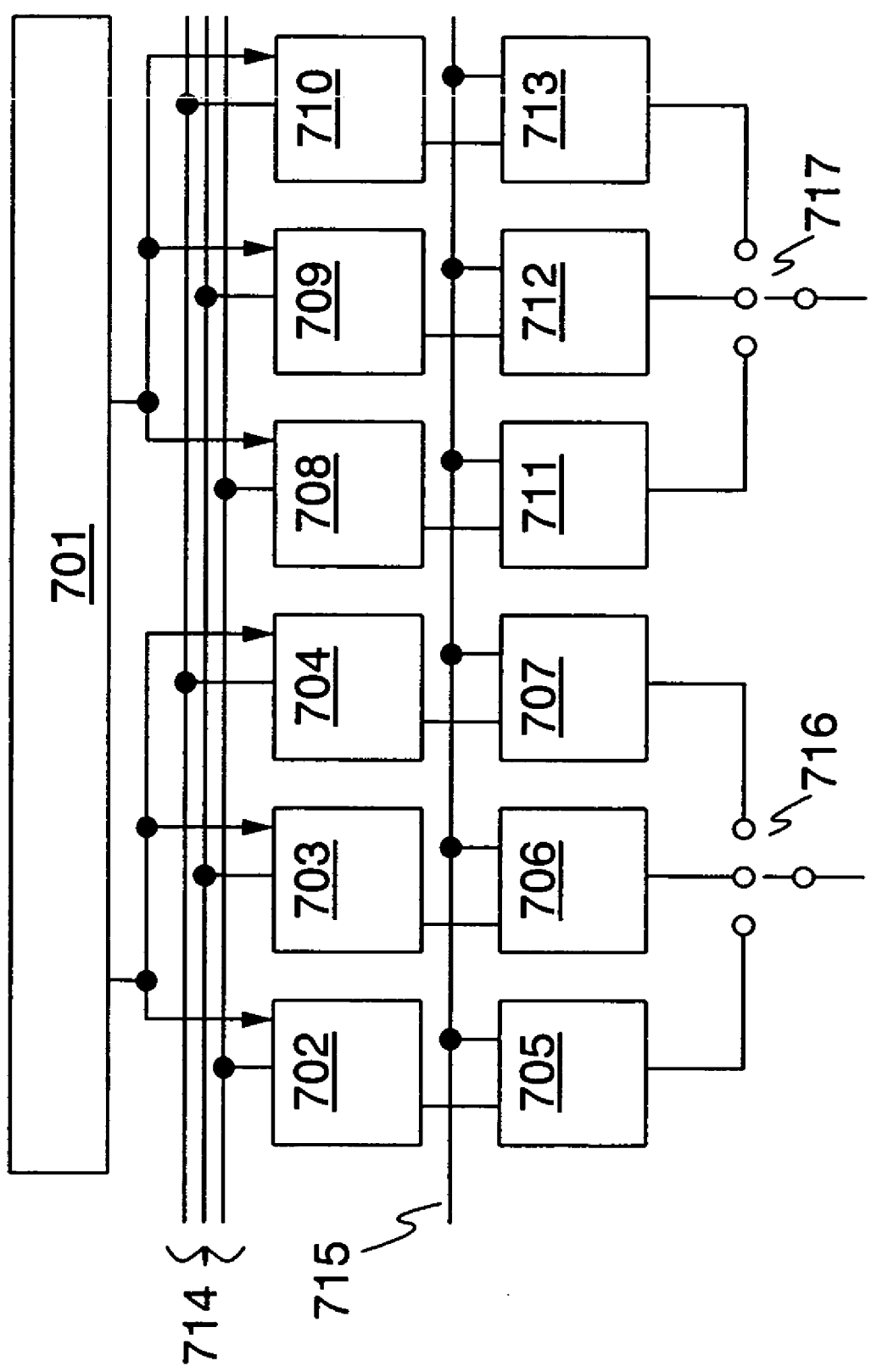
FIG. 7 is a block diagram showing a source signal line driver circuit of a display device of the invention.

Shown in FIG. 7 is an embodiment of a source signal line driver circuit which has a different configuration from that of Embodiment 1. This source signal line driver circuit corresponds to the pixel configuration shown in Embodiment 2. Digital video signals from a video signal line 714 are sequentially stored in latch circuits 702 to 704 and 708 to 710 with output pulses from a shift register 701. After the video signals corresponding to one line is stored, the video signals are transferred to latch circuits 705 to 707 and 711 to 713 with a latch pulse of a latch signal line 715.

The operations set forth so far are the same as those of Embodiment 3. Thereafter, output signals from the latch circuits 705 to 707 are switched with a switch 716 and each output signal is outputted to a source signal line during one-third of one line period. By the above operation, the number of source signal lines can be reduced. That is, a signal of the source signal line can be utilized in a time division manner. Here, the output signal is tripartitioned, however, the invention is not exclusively limited to tripartition. Similarly, output signals from the latch circuits 711 to 713 can be switched with a switch 717 and thus can be outputted to the source signal line.

Embodiment 5

Figure 8:
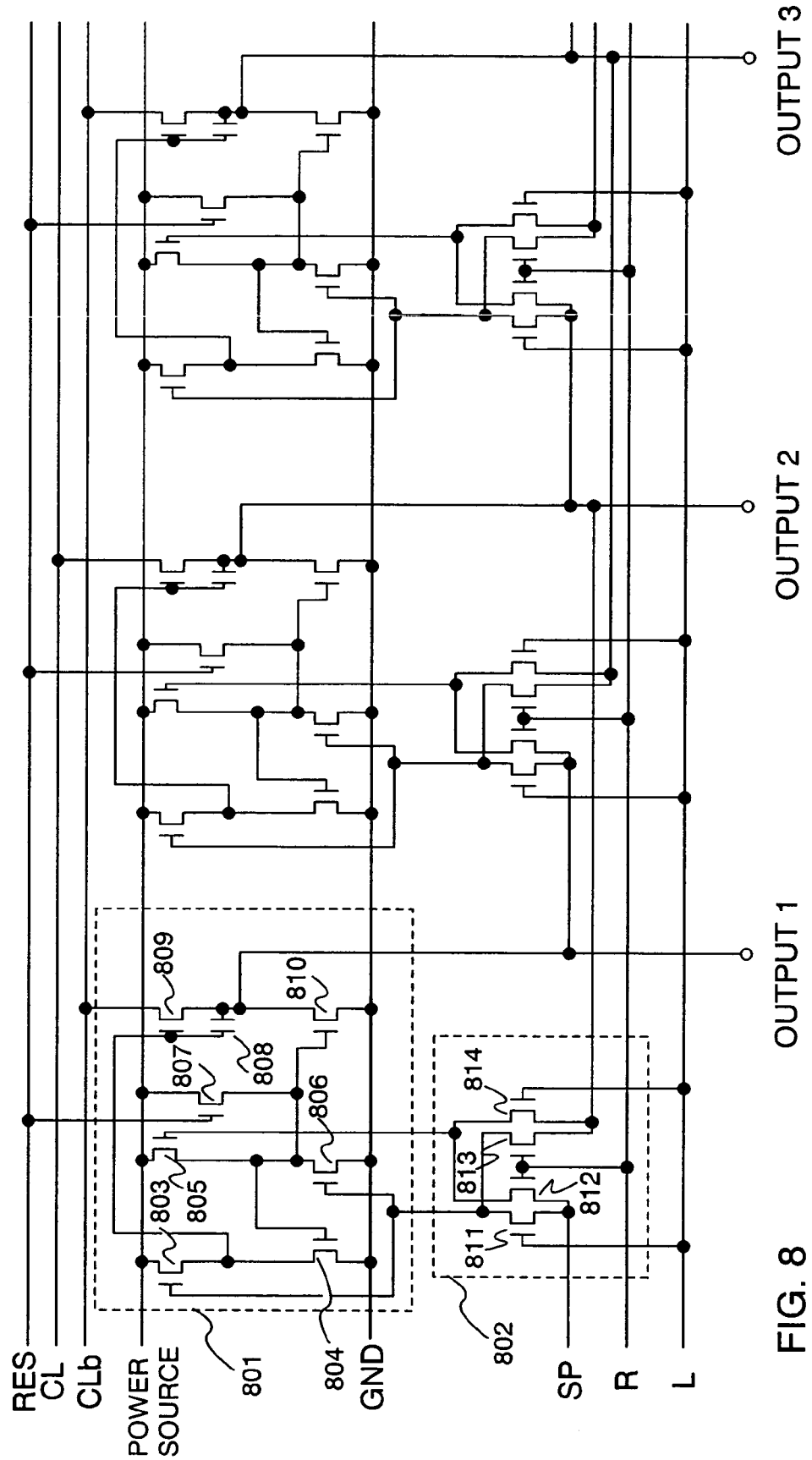
FIG. 8 is a configuration diagram showing a signal line driver circuit using unipolar TFTs.

Shown in FIG. 8 is a configuration example of a shift register using unipolar TFTs. Such a signal line driver circuit or other circuits of one polarity serves for the reduction in cost of a display device. Note that, N-channel unipolar TFTs are used in the example shown in FIG. 8, however, either P-channel unipolar TFTs only or N-channel unipolar TFTs only may be used. The use of unipolar process serves for the reduction in the number of masks.

In FIG. 8, start pulses are inputted to a scanning direction changing switch 802, and through a switching TFT 811, they are inputted to a shift register 801. The shift register 801 is a set reset type shift register which uses a boot strap. Operation of the shift register 801 is explained below.

Start pulses are inputted to gates of TFTs 803 and 806. When the TFT 806 is turned ON, a gate potential of a TFT 804 becomes Lo, thereby turning OFF the TFT 804. Meanwhile, as a gate potential of a TFT 810 becomes Lo, the TFT 810 is also turned OFF. A gate potential of the TFT 803 is raised to the level of the power source potential. Therefore, a gate potential of a TFT 809 is firstly raised to (the power source potential−|Vgs|). Since an initial potential of an output 1 is Lo, the TFT 809 is to raise its source potential while charging the output 1 and a capacitor 808. When the gate potential of the TFT 809 reaches (the power source potential−|Vgs|), the TFT 809 is still ON, thus the potential of the output 1 further keeps on increasing. As the gate of the TFT 809 has no electric discharge path, the gate potential of the TFT 809 keeps on increasing along with its source potential even past the power source potential.

When the drain and source potentials of the TFT 809 become equal to each other, current flow to the output stops, thus the rise in potential of the TFT 809 is terminated. In this manner, a Hi potential which is equal to the power source potential can be outputted from the output 1. At this time, a potential of CLb is Hi. When the potential of CLb is changed to Lo, a charge accumulated in the capacitor 808 is discharged through the TFT 809 to CLb, thus the potential of the output 1 becomes Lo. A pulse of the output 1 is transferred to the shift register of the subsequent stage. Described above is the operation of the circuit of Embodiment 5. This embodiment can be freely combined with other embodiments of the invention.

Embodiment 6

Figure 9:
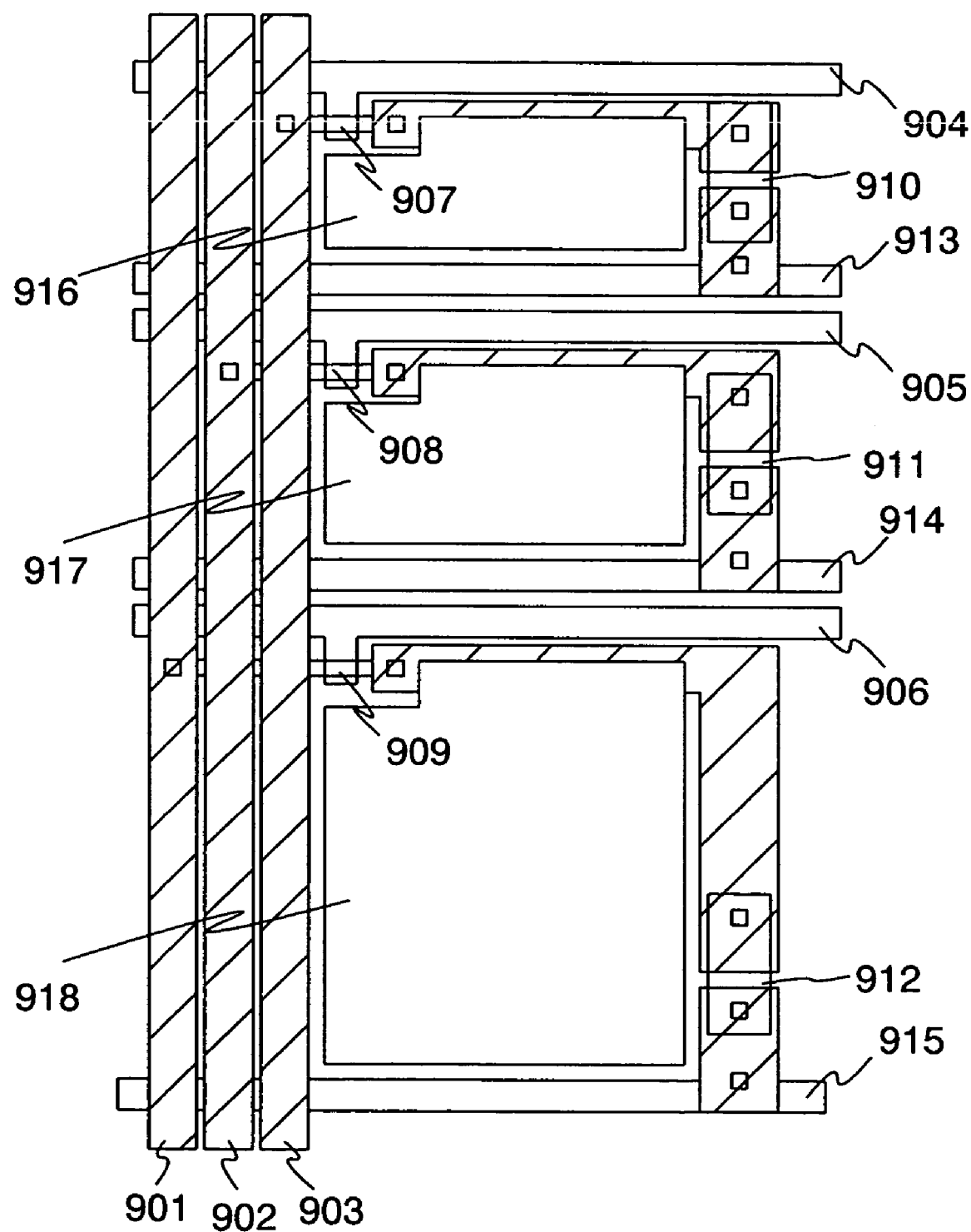
FIG. 9 is a plan view of a pixel of the invention.

Shown in FIG. 9 is a plan view of a pixel shown in Embodiment 1. The pixel comprises source signal lines 901 to 903, gate signal lines 904 to 906, TFTs 907 to 909, nonvolatile memory elements 910 to 912, common electrodes 913 to 915, and pixel electrodes 916 to 918. Note that, a 3-bit gradation is taken as an example in this embodiment, however, the invention is not exclusively limited to 3-bit. As shown in FIG. 9, the nonvolatile memory elements 910 to 912 occupies small areas. Therefore, a memory circuit can be incorporated without decreasing an aperture ratio.

Meanwhile, by setting an area ratio of the pixel electrodes 916, 917, and 918 at 1:2:4, a 3-bit area gradation can be realized. Similarly, in the case of an n-bit area gradation, by providing n pieces of sub-pixels and setting an area ratio of each sub-pixel at one to two raised to the (n−1)th power, the gradations can be also realized.

Embodiment 7

Steps for manufacturing a display device of the invention will be explained. Specifically explained herein are the steps for manufacturing a switching TFT to configure a pixel portion, a TFT to configure a driver circuit or other logic circuits, and a capacitor utilizing a ferroelectric material to configure a nonvolatile latch circuit concurrently on the same substrate with reference to FIGS. 10 to 13. FIGS. 10 to 13 are sectional views showing the manufacturing steps.

First, in FIG. 10A, a glass substrate such as barium borosilicate glass and aluminum borosilicate glass, a quartz substrate, a stainless (SUS) substrate, and the like can be used as a substrate 1000. Also, although a substrate made from a synthetic resin having flexibility, such as plastic, generally tends to have a lower heat resistance temperature as compared to the substrates described above, it is possible to utilize the synthetic resin substrate as the substrate 1000 as long as they are capable of withstanding the process temperatures in the manufacturing steps.

Base films 1001 and 1002 formed of insulating films such as silicon oxide films, silicon nitride films, or silicon oxynitride films are formed over the substrate 1000. For example, the silicon oxynitride film 1001 formed of $SiH_4$, $NH_3$, and $N_2O$ is formed to have a thickness of 10 to 200 nm (desirably, 50 to 100 nm) by a plasma CVD method, and the hydrogenated silicon oxynitride film 1002 formed of $SiH_4$ and $N_2O$ is similarly laminated thereon to have a thickness of 50 to 200 nm (desirably, 100 to 150 nm). In this embodiment, bilayer base films are shown, however, the base films are not limited to the bilayer structure, and may be a single layer or a multilayer structure of more than two layers formed of the above-mentioned insulating film. In addition, the base films may not necessarily be provided when using a quartz substrate and the like since its impurity diffusion does not become a big problem.

Island-shaped semiconductor layers 1003 to 1005 are each formed of crystalline semiconductor films manufactured by processing a semiconductor film having an amorphous structure with a laser crystallization method or a known thermal crystallization method (see FIG. 10B). The film thickness of the island-shaped semiconductor layers 1003 to 1005 is to be 25 to 100 nm (desirably, 30 to 60 nm). Note that, the island-shaped semiconductor layers 1003 to 1005 may be amorphous semiconductors or polycrystalline semiconductors. Also, not only silicon but also silicon germanium may be utilized for the semiconductor films. In the case of utilizing the silicon germanium, a concentration of the germanium is desirably within a range from 0.01 to 4.5 atomic %.

For manufacturing the crystalline semiconductor film by using a laser crystallization method, laser such as a pulse oscillation type or continuous emission type excimer laser, a YAG laser, or a $YVO_4$ laser is adopted. A method of condensing laser light emitted from a laser oscillator into a linear shape by an optical system and then irradiating the light to the semiconductor film may be employed when these types of lasers are used. The crystallization conditions may be selected by an operator appropriately. However, the pulse oscillation frequency is set at 30 Hz, and the laser energy density is set at 100 to 400 $mJ/cm^2$ (typically between 200 and 300 $mJ/cm^2$) when using the excimer laser. Further, in the case of using the YAG laser, its second harmonic may be utilized to set the pulse oscillation frequency at 1 to 10 kHz, and the laser energy density may be set at 300 to 600 $mJ/cm^2$ (typically between 350 and 500 $mJ/cm^2$). A laser light, which has been condensed into a linear shape with a width of 100 to 1000 μm, for example 400 μm here, is irradiated over the whole surface of the substrate. This is performed with an overlap ratio of 80 to 98%.

Next, a gate insulating film 1006 is formed so as to cover the island-shaped semiconductor layers 1003 to 1005. The gate insulating film 1006 is formed of an insulating film containing silicon in thickness of 40 to 150 nm by a plasma CVD method or a sputtering method. In this embodiment, the gate insulating film 1006 is formed of a silicon oxynitride film with a thickness of 120 nm. It is needless to mention that the gate insulating film 1006 is not limited to such a silicon oxynitride film and other insulating film containing silicon may be employed in a single layer or a multilayer structure. For example, in the case of using a silicon oxide film, the silicon oxide film is formed by mixing TEOS (Tetraethyl Ortho silicate) and $O_2$ with the plasma CVD method, setting a reactive pressure and a substrate temperature at 40 Pa and 300 to 400° C. respectively, and discharging the mixture of TEOS with $O_2$ at a high frequency (13.56 MHz) and a power flux density of 0.5 to 0.8 W/cm2. The silicon oxide film manufactured in this manner is thereafter subjected to thermal annealing at 400 to 500° C., thus favorable characteristics as a gate insulating film can be obtained.

Gate electrodes 1100 to 1102 are formed on the gate insulating film 1006 as shown in FIG. 11A. The gate electrodes 1100 to 1102 may be formed of Tantalum (Ta), Titanium (Ti), molybdenum (Mo), tungsten (W), an alloy containing the above metal element as its main component, polycrystalline silicon, and the like. The gate electrodes 1100 to 1102 are formed by forming a conductive layer on the surface of the gate insulating film 1006, and then etching the conductive layer with a resist mask (not shown in the figure).

Then, an impurity element which imparts N-type conductivity is doped, thus N-type low concentration impurity regions 1103 to 1108 are formed in a semiconductor active layer.

Next, a resist mask (not shown) is formed so as to cover the gate electrode 1102, an N-type impurity element is added in a self-aligned manner using the gate electrode 1101 and the resist mask as masks, and a P-type impurity element is added in a self-aligned manner using the gate electrode 1101 as a mask.

In this manner, high concentration N-type impurity regions 1111 to 1114 which function as a source region or a drain region of an N-channel TFT, and high concentration P-type impurity regions 1109 and 1110 which function as a drain region of a P-channel TFT are formed. As the impurity element for imparting N-type conductivity, phosphorous (P) or arsenic (As) is used, and as the impurity element for imparting P-type conductivity, Boron (B) is used.

Subsequently, activation of the N type and P type impurity elements is carried out by any following method of furnace annealing, laser annealing, lamp annealing or a combination of these. As for the thermal annealing method, it is performed in a nitrogen atmosphere where an oxygen concentration is 1 ppm or less or, desirably, 0.1 ppm or less at 400 to 700° C.

Further, as shown in FIG. 11C, a first interlayer insulating film 1115 formed of a silicon nitride film or a silicon oxynitride film is formed over the gate electrodes 1100 to 1102.

Thus, a switching TFT for configuring a pixel portion and a TFT for configuring a driver circuit and other logic circuits are formed on the same substrate. Next, a capacitor is formed on the first interlayer insulating film 1115 by utilizing a ferroelectric material.

First, a lower electrode layer 1201 is formed (see FIG. 12A). For the formation of the lower electrode layer 1201, a CVD method, a sputtering method, an ion beam sputtering method, a laser ablation method, and the like may be adopted. As for a material used for the lower electrode layer 1201, $Pt/IrO_2$, $Pt/Ta/SiO_2$ and the like may be utilized. As electrical characteristics of a ferroelectric thin film largely depends on an alignment of a crystal, it is particularly desirable that Pt which can easily control the alignment is utilized for the surface of the lower electrode. After forming the metalic film, unnecessary portions are processed by plasma etching in order to form the lower electrode layer 1201.

Next, a ferroelectric layer 1202 is formed over the lower electric layer 1201 (see FIG. 12B). As the ferroelectric, lead-containing perovskite such as PZT and $PbTiO_3$, a bismuth layer compound such as $Bi_4Ti3O_{12}$, an ilmenite-based compound such as $LiNbO_3$ and $LiTaO_3$ may be utilized. Above all, the ferroelectriric using the lead-containing perovskite, PZT is favorably utilized since it shows ferroelectric characteristics over a wide range of composition.

For the formation of the ferroelectric layer 1202, a CVD method, a sputtering method, an ion beam sputtering method, a laser ablation method, and the like may be adopted. Above all, the CVD method is favorably used since it has high controllability of film composition and crystallinity, and thus achieves a large-sized screen and mass production. In the case of using the CVD method, the following conditions are required for the material: having a high vapor pressure relatively at a low temperature; a long-term stability; a precipitating rate which is decided by the amount of raw material supply within a range of a deposition temperature, wherein a nucleating reaction in the vapor phase is not caused. In light of the above points, PZT is still appropriate for the material.

The formation of the ferroelectric layer by the CVD method may be followed by known steps. For example, a ferroelectric layer using PZT can be formed at a pressure of 660 Pa and a substrate temperature of 500 to 650° C.

Next, an upper electrode layer 1203 is formed on the ferroelectric layer 1202 (see FIG. 12C). For the formation thereof, a CVD method, a sputtering method, an ion beam sputtering method, a laser ablation method, and the like may be adopted as the lower electrode layer 1201. As a material used for the layer, $Ir/IrO_2$ and the like may be utilized in addition to the material used for the lower electrode layer 1201.

Figure 13A:
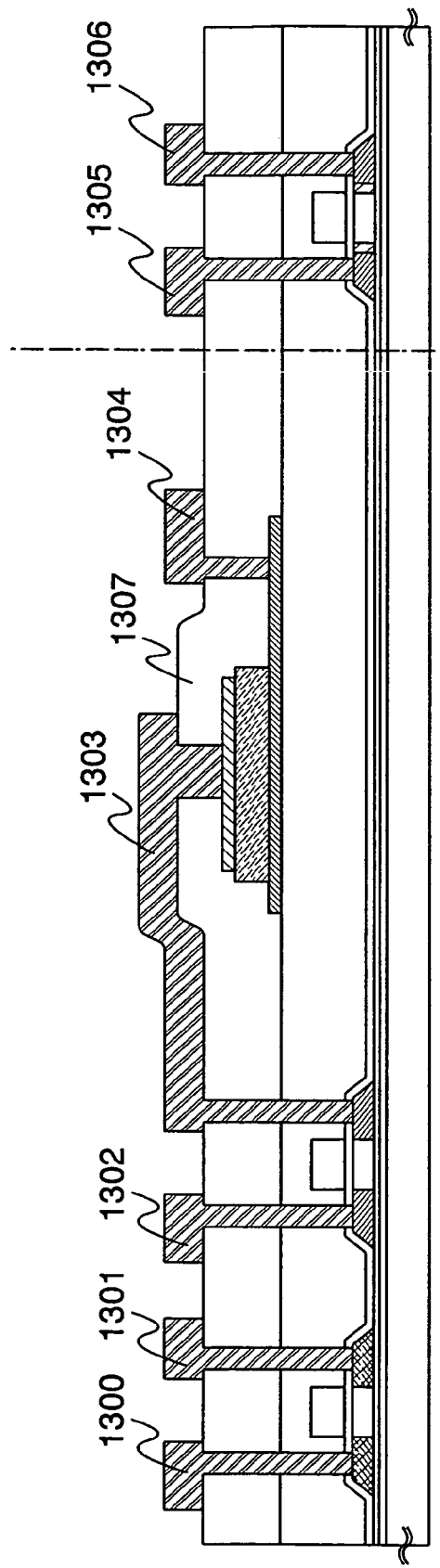
FIGS. 13A and 13B are sectional views showing structures of the invention.

As shown in FIG. 13A, a second interlayer insulating film 1307 using a silicon nitride film or a silicon oxynitride film is formed. Then, contact holes are formed and wirings 1300 to 1306 are formed through the contact holes. A mode of electrical connections between the wirings 1300 to 1306 and TFTs are not exclusively limited to this embodiment.

Figure 13B:
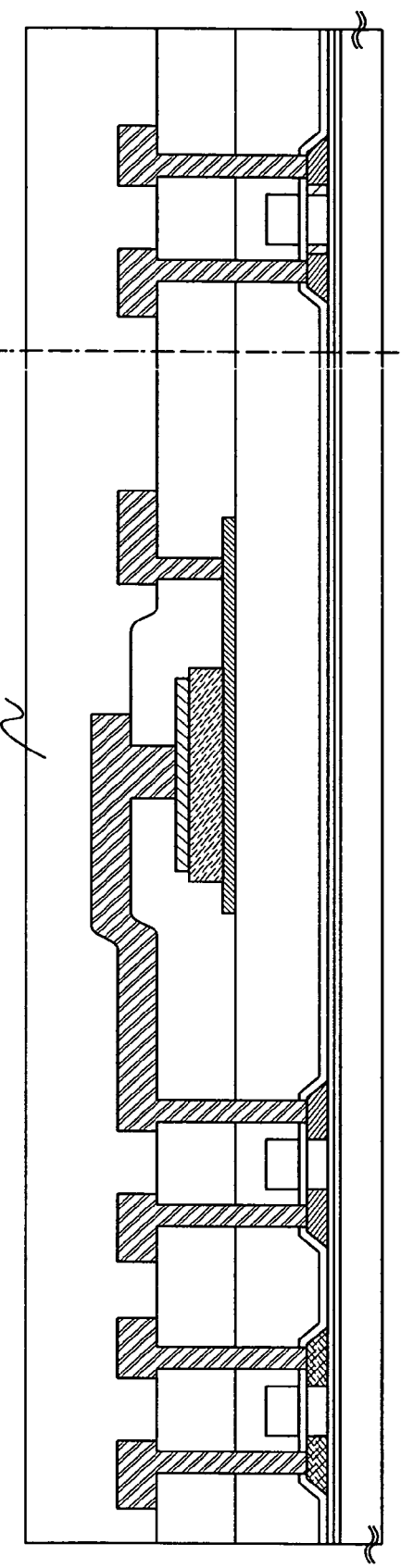
Figure 14:
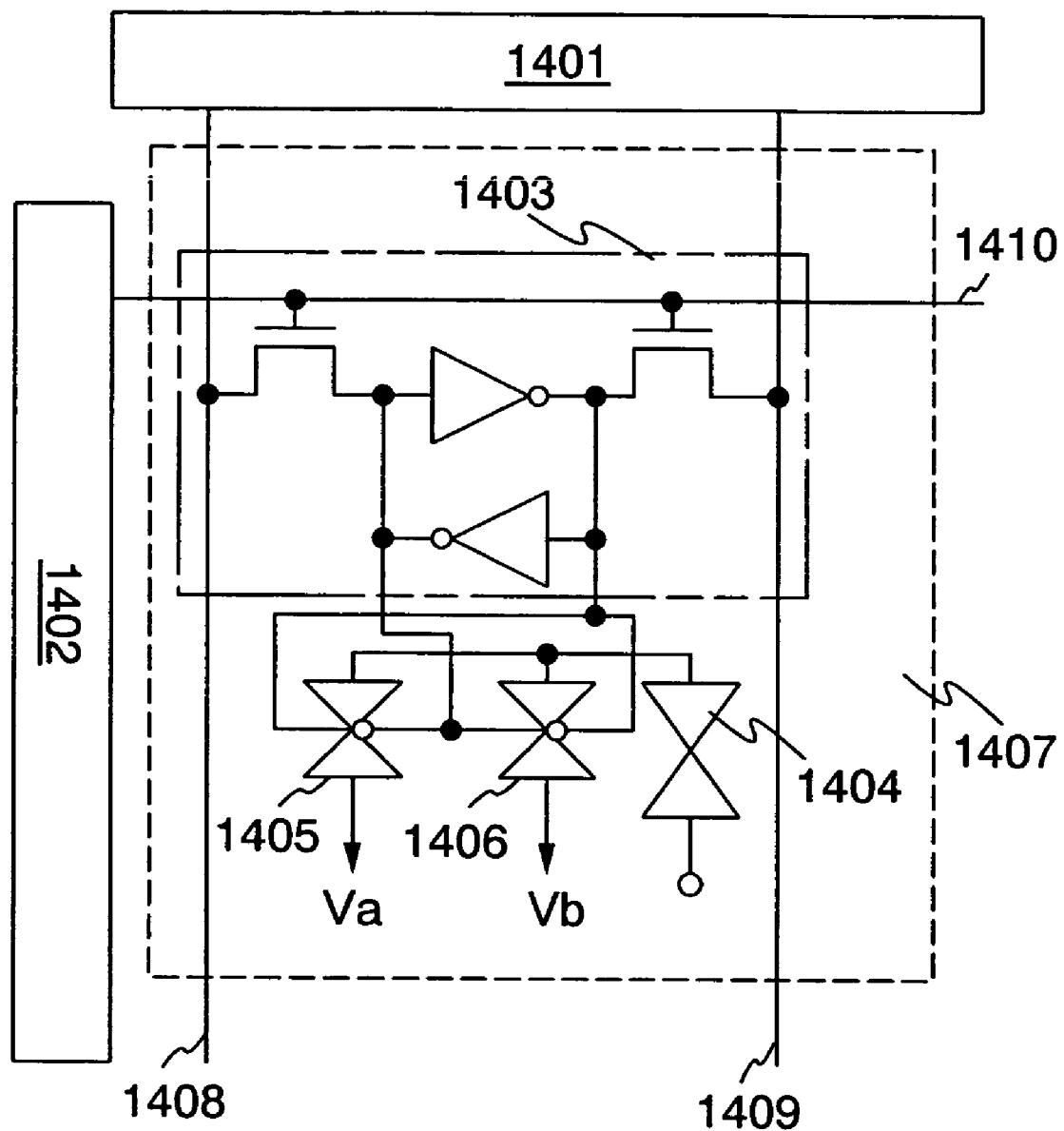
FIG. 14 is a configuration diagram of a pixel of a conventional display device provided with an SRAM inside its pixel portion.

At the end, a protective layer 1308 is formed over the second interlayer insulating film 1307 as shown in FIG. 13B. As a material for the protective layer 1308, a photo-curing or thermo-curing organic resin material such as a polyimide resin or an acrylic resin can be used.

Through the above-mentioned steps, a TFT for configuring a pixel portion, a TFT for configuring a driver circuit and other logic circuits, and a capacitor using a ferroelectric material for configuring a nonvolatile latch circuit can be concurrently formed on the same substrate.

It is to be noted that, in this embodiment, a structure having an LDD region which does not overlap with a gate electrode is adopted to the switching TFT for configuring the pixel portion, and a single drain structure is adopted to the TFT for configuring the driver circuit and the logic circuits. However, this embodiment is not exclusively limited to these structures. Any TFT structure which is suitably applied to a GOLD structure or other LDD structures and the like may be manufactured according to known steps as needed.

Embodiment 8

Figure 16:
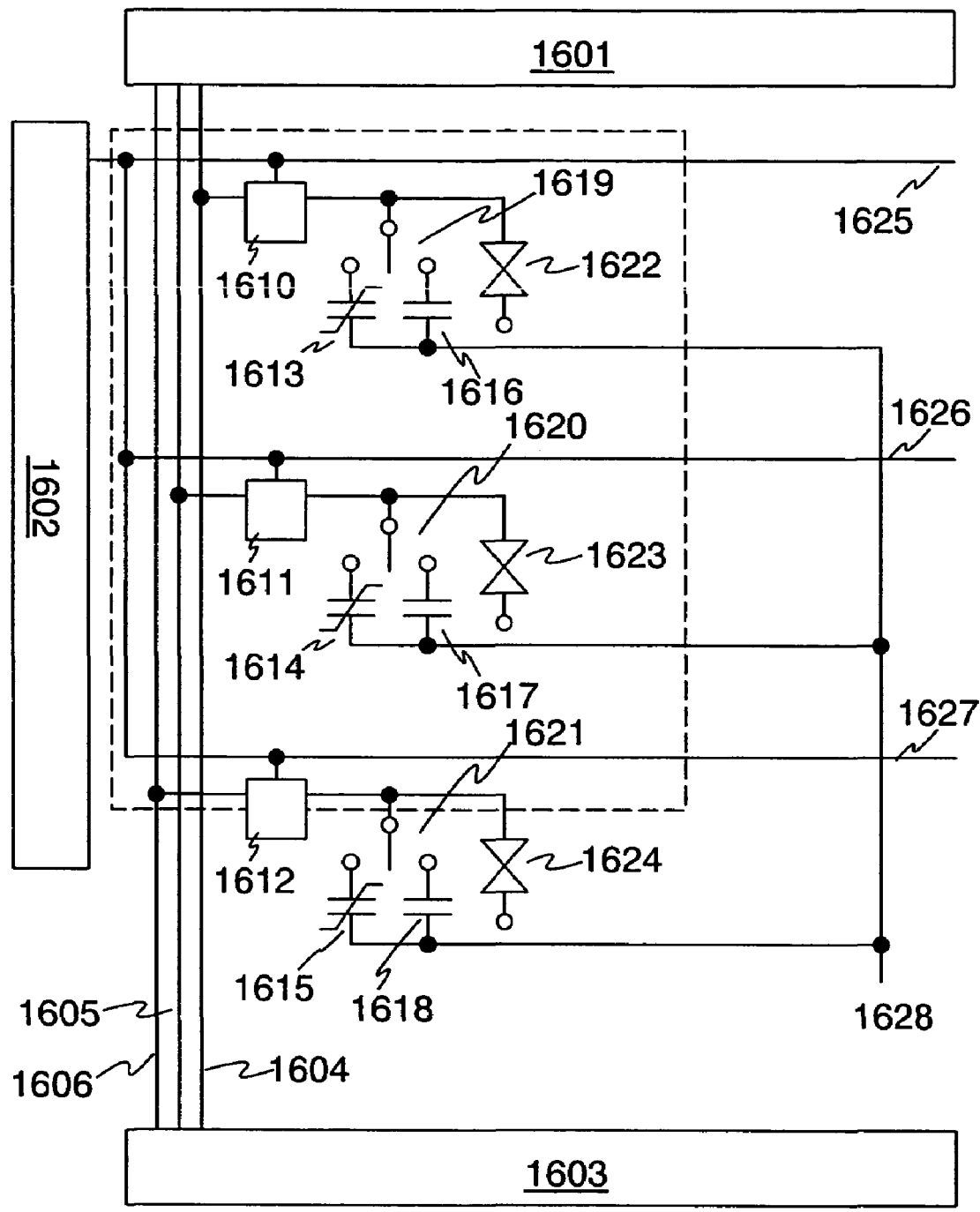
FIG. 16 is a configuration view of an embodiment in which the invention is combined with a DRAM type pixel.

Shown in FIG. 16 is an embodiment in which a conventional display method and a display method of the invention are combined. In the case of displaying a still image, digital video signals are outputted to source signal lines 1604 to 1606 by a source signal line driver circuit 1601. At this time, nonvolatile memories are selected by switches 1619 to 1621. When gate signal lines 1625 to 1627 are selected by a gate signal line driver circuit 1602, switching elements 1610 to 1612 are turned ON and the video signals are written into nonvolatile memories 1613 to 1615 and liquid crystals 1622 to 1624.

In the case of displaying a moving image, analog video signals are outputted to the source signal lines 1604 to 1606 by a source signal line driver circuit 1603. At this time, storage capacitors 1616 to 1618 are to be selected by the switches 1619 to 1621. When the gate signal lines 1625 to 1627 are selected by the gate signal line driver circuit 1602, the switching elements 1610 to 1612 are turned ON and the analog video signals are written into the storage capacitors 1616 to 1618 and the liquid crystals 1622 to 1624. In this manner, a display operation is performed.

Figure 18:
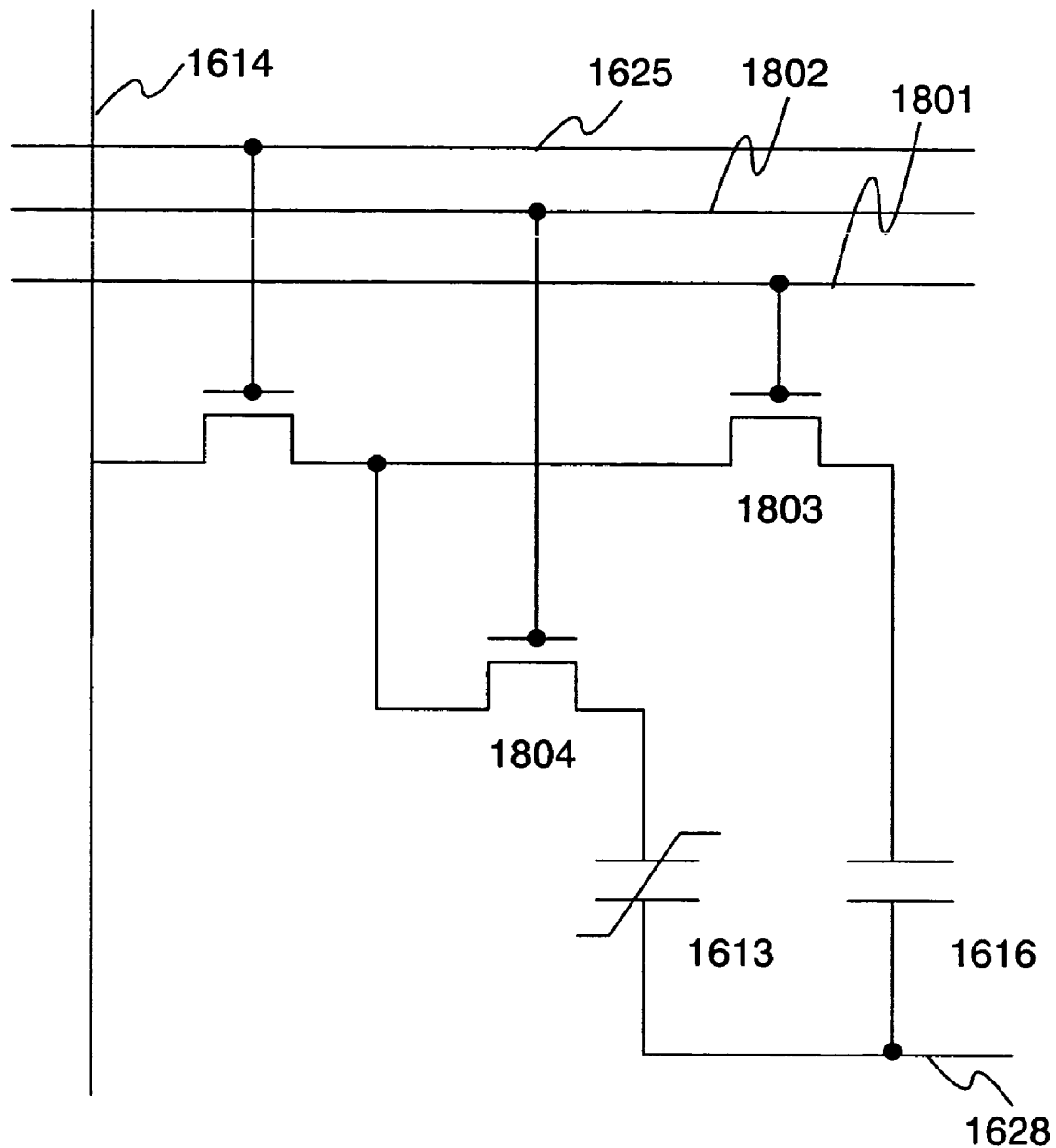
FIG. 18 is a circuit of an embodiment of the invention.
Figure 19:
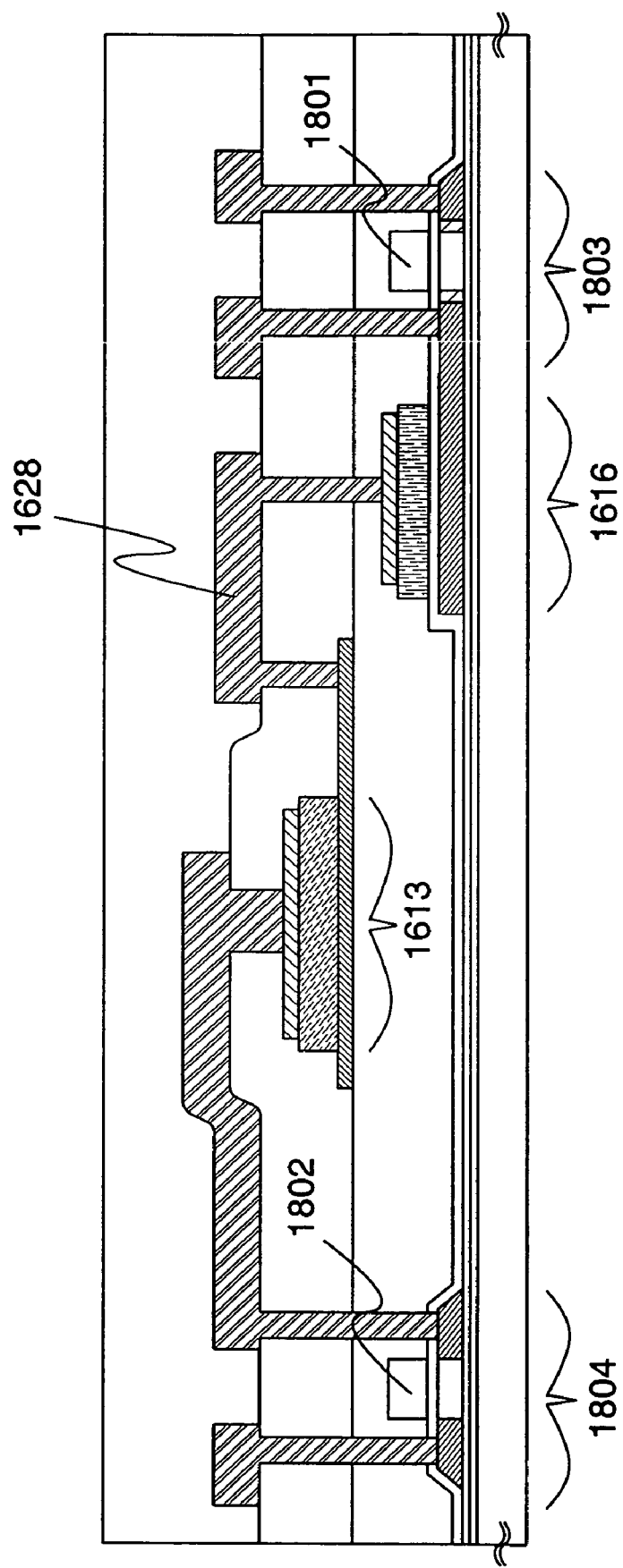
FIG. 19 is a cross-sectional view of a pixel including a non-volatile memory and a storage capacitor of the invention.

FIG. 18 shows an example of the circuit of this embodiment. The gate signal line 1801 is selected when displaying a moving image. By selecting the gate signal line 1801, the transistor 1803 is turned on. Also, the gate signal line 1802 is selected when displaying a still image. By selecting the gate signal line 1802, the transistor 1804 is turned on. Also, the cross sectional structure of the pixel including the non-volatile memory 1613 and the storage capacitor 1616 are shown in FIG. 19.

Embodiment 9

Figure 17:
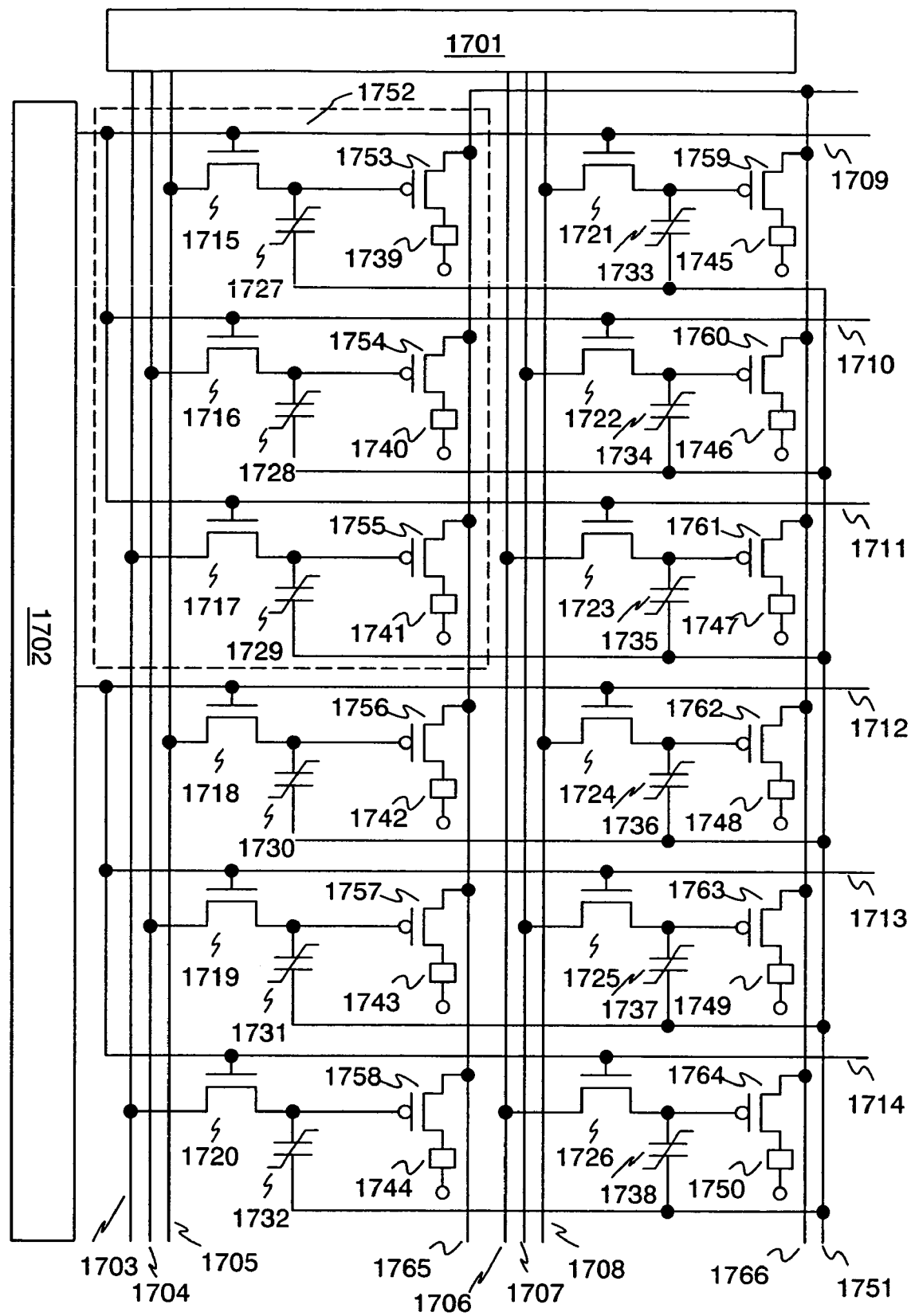
FIG. 17 is a configuration diagram in which the invention is applied to an EL display device.

Shown in FIG. 17 is a configuration of an embodiment of the invention. In this embodiment, an EL display device having a 3-bit gradation is shown. Note that, a 3-bit gradation is taken as an example in this embodiment, however, the invention is not exclusively limited to 3-bit. In this embodiment, switching elements and driver elements are employed, which are referred to as switching TFTs and driver TFTs respectively in the explanation hereinbelow. However, the switching elements and the driver elements are not exclusively limited to TFTs.

One pixel 1752 comprises three switching TFTs 1715 to 1717, three nonvolatile memory elements 1727 to 1729, three driver TFTs 1753 to 1755, and three EL elements 1739 to 1741. ON/OFF operations of the switching TFTs are controlled by gate signal lines. One terminal of each nonvolatile memory element is connected to each switching TFT and the other terminal thereof is connected to a common electrode 1751. Either a drain or a source of each switching TFT is electrically connected to a source signal line, the other is electrically connected to a nonvolatile memory element and a gate of the driver TFT, and a gate thereof is electrically connected to a gate signal line. A source of each driver TFT is electrically connected to power supply lines 1765 and 1766, and a drain thereof is electrically connected to an EL element via a pixel electrode (not shown in the figure).

Digital video signals are outputted from a source signal line driver circuit 1701 to source signal lines 1703 to 1708. When gate signal lines 1709 to 1711 are selected by a gate signal line driver circuit 1702, the switching TFTs 1715 to 1717 and switching TFTs 1721 to 1723 are turned ON and the digital video signals from the source signal lines 1703 to 1708 are written into the nonvolatile memory elements 1727 to 1729 and nonvolatile memory elements 1733 to 1735. When the selection of the gate signal lines 1709 to 1711 are released by the gate signal line driver circuit 1702, the switching TFTs 1715 to 1717 and 1721 to 1723 are turned OFF. However, as the signals are stored in the nonvolatile memory elements 1727 to 1729 and 1733 to 1735, the gates of the driver transistors 1753 to 1755 and 1759 to 1761 are also in the state of having the stored signals. Therefore, EL elements 1739 to 1741 and 1745 to 1747 can drive based on the stored signals and thus perform a display operation.

Next, when gate signal lines 1712 to 1714 are selected by the gate signal line driver circuit 1702, switching TFTs 1718 to 1720 and 1724 to 1726 are turned ON and the digital video signals from the source signal lines 1703 to 1708 are written into nonvolatile memory elements 1730 to 1732 and 1736 to 1738. When the selection of the gate signal lines 1712 to 1714 are released by the gate signal line driver circuit 1702, the switching TFTs 1718 to 1720 and 1724 to 1726 are turned OFF. However, as the signals are stored in the nonvolatile memory elements 1730 to 1732 and 1736 to 1738, the gates of the driver transistors 1756 to 1758 and 1762 to 1764 are also in the state of having the stored signals. Therefore, EL elements 1742 to 1744 and 1748 to 1750 can drive based on the stored signals and thus perform a display operation.

In this embodiment, three source signal lines are provided corresponding to one pixel column. However, one source signal line may be provided corresponding to one pixel column and three gate lines may be provided as shown in Embodiment 2.

According to the invention, a display operation is performed with an area gradation system since signals are stored digitally. That is, when a 3-bit display operation is to be performed, a gradation can be expressed by setting an area ratio of the pixel electrodes at 4:2:1, and storing a necessary signal according to a required gradation. As described above, the invention is not exclusively limited to 3-bit. Further, the driver TFTs may be driven in a saturation region and the EL elements may be driven with a constant current, or the driver TFTs may be driven in a linear region and the EL elements may be driven with a constant voltage.

When a ferroelectric material such as PZT is utilized for the nonvolatile memory element, the signal can be stored even when the power source is turned OFF. Therefore, when a still image is displayed, the power source of the display device can be turned OFF and the electricity can thus be reduced. In this manner, a refreshing operation which has been the conventional problem can be omitted and the power consumption can be reduced. The ferroelectric material is not exclusively limited to PZT and other materials can be utilized as well.

Also, according to the invention, unlike a display device using an SRAM, a large number of transistors are not required inside a pixel. Therefore, it can be driven without causing such problems as a case where the transistors cannot be embedded in the pixel when a pixel area is small or where an aperture ratio is notably reduced.

Further, the source signal line driver circuit, the gate signal line driver circuit, or other circuits used in the invention can be integrally formed on the same substrate as the pixels, while they can be formed on the separate substrates using the techniques of COG or TAB and the like.

Embodiment 10

A display device manufactured accordance to the foregoing embodiments can be used as a display portion of various electronic apparatuses. Such electronic apparatuses each incorporating the display device manufactured according to the invention as a display medium are described below.

Examples of the electronic apparatuses include video cameras, digital cameras, head mounted displays (goggle type displays), game machines, car navigation systems, personal computers, portable information terminals (mobile computers, mobile telephones, electronic books, etc.) Specific examples of these electronic apparatuses are shown in FIGS. 15A to 15G.

Figure 15A:
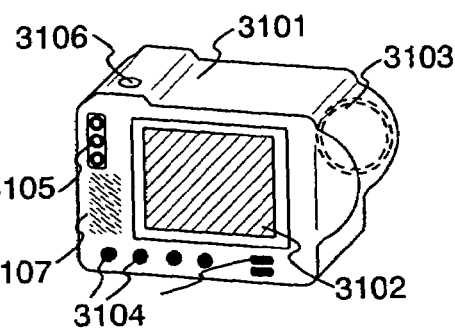
FIGS. 15A to 15G are examples of electronic apparatuses to which the invention can be applied.

FIG. 15A is a digital camera including a main body 3101, a display portion 3102, an image-receiving portion 3103, operation keys 3104, an external connection port 3105, a shutter 3106, an audio output portion 3107, and the like. The display device of the invention can be used in the display portion 3102.

Figure 15B:
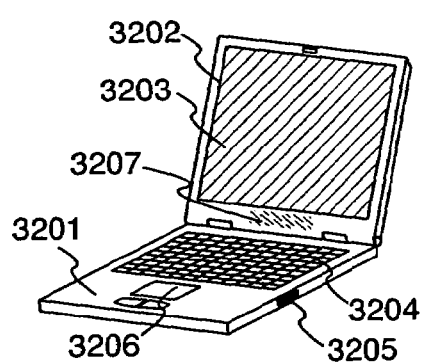

FIG. 15B is a notebook type personal computer including a main body 3201, a frame 3202, a display portion 3203, a keyboard 3204, an external connection port 3205, a pointing mouse 3206, an audio output portion 3207, and the like. The display device of the invention can be used in the display portion 3203.

Figure 15C:
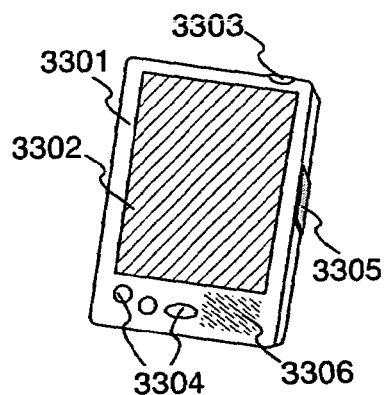

FIG. 15C is a PDA including a main body 3301, a display portion 3302, a switch 3303, operation keys 3304, an infrared port 3305, an audio output portion 3306, and the like. The display device of the invention can be used in the display portion 3302.

Figure 15D:
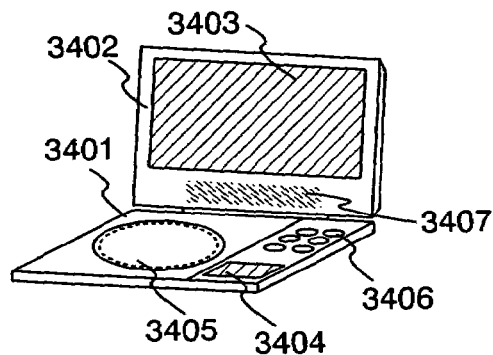

FIG. 15D is an image reproduction device provided with a recording medium (specifically, a DVD playback device) including a main body 3401, a frame 3402, a display portion (a) 3403, a display portion (b) 3404, a recording medium (CD, LD, DVD, etc.) read-in portion 3405, operation keys 3406, an audio output portion 3407, and the like. The display portion (a) 3403 mainly displays image information and the display portion (b) 3404 mainly displays character information. The display device of the invention can be used in the display portions (a) 3403 and (b) 3404. It is to be noted that the invention may be applied to CD reproduction devices and game machines for domestic use and the like as the image reproduction devices provided with recording mediums.

Figure 15E:
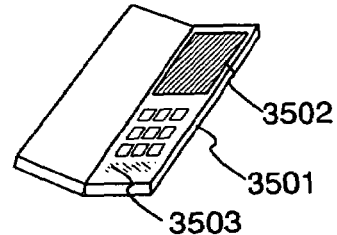

FIG. 15E is a portable display device for folded type including a main body 3501, a display portion 3502, an audio output portion 3503, and the like. The display device of the invention can be used in the display portion 3502 in the main body 3501.

Figure 15F:
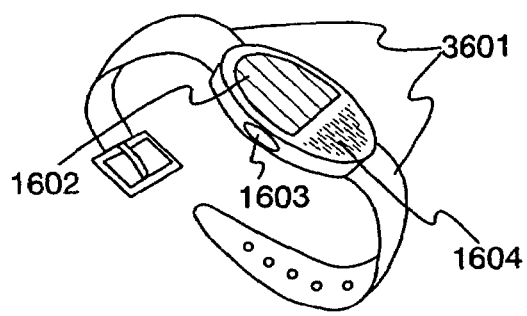

FIG. 15F is a watch type display device including bands 3601, a display portion 3602, an operation switch 3603, an audio output portion 3604, and the like. The display device of the invention can be used in the display portion 3602.

Figure 15G:
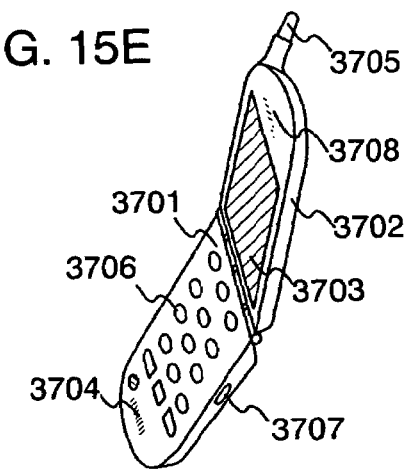

FIG. 15G is a mobile phone including a main body 3701, a frame 3702, a display portion 3703, an audio input portion 3704, an antenna 3705, operation keys 3706, an external connecting port 3707, an audio output portion 3708, and the like. The display device of the invention can be used in the display portion 3703.

As described above, an application range of the invention is so wide that the invention can be applied to electronic apparatuses in various fields. The electronic apparatuses in this embodiment can be provided in a structure of any combination of Embodiments 1 to 9.

In a conventional active matrix display device, a refreshing operation of a pixel has to be performed at a fixed cycle.

Therefore, even when a still image is outputted, writing is required, which results in the high power consumption. Further, in a display device to which an SRAM is applied, a large number of TFTs are needed in each pixel. Therefore, the transistors cannot be embedded in the pixel when a pixel area is small, or otherwise, an aperture ratio is reduced.

According to the invention, a refreshing operation at the time when a still image is displayed can be omitted by incorporating a nonvolatile memory element into a pixel. Furthermore, as a signal is stored with a small number of elements, a display operation can be performed without notably decreasing an aperture ratio.

What is claimed is:

1. A display device comprising:
   a source signal line;
   a gate signal line;
   a common electrode; and
   a pixel comprising:
      a switching element;
      a nonvolatile memory element; and
      a pixel electrode,
   wherein:
   an input terminal of the switching element is electrically connected to the source signal line;
   an output terminal of the switching element is electrically connected to the pixel electrode;
   the nonvolatile memory element is electrically connected between the pixel electrode and the common electrode; and
   a control terminal of the switching element is electrically connected to the gate signal line.

2. A display device comprising:
   a source signal line;
   a gate signal line;
   a common electrode; and
   a pixel comprising a plurality of sub-pixels, each of the sub-pixels comprising:
      a switching element;
      a nonvolatile memory element; and
      a pixel electrode,
   wherein:
   an input terminal of the switching element is electrically connected to the source signal line;
   an output terminal of the switching element is electrically connected to the pixel electrode;
   the nonvolatile memory element is electrically connected between the pixel electrode and the common electrode; and
   a control terminal of the switching element is electrically connected to the gate signal line.

3. A display device comprising:
   a plurality of source signal lines;
   a gate signal line;
   a common electrode; and
   a pixel comprising a plurality of sub-pixels, each of the sub-pixels comprising:
      a switching element;
      a nonvolatile memory element; and
      a pixel electrode,
   wherein:
   an input terminal of the switching element is electrically connected to corresponding one of the plurality of source signal lines;
   an output terminal of the switching element is electrically connected to the pixel electrode;
   the nonvolatile memory element is electrically connected between the pixel electrode and the common electrode;
   a control terminal of the switching element is electrically connected to the gate signal line; and
   each switching element in the pixel is electrically connected to different one of the plurality of source signal lines.

4. A display device comprising:
   n lines of source signal lines;
   a gate signal line;
   a common electrode; and
   a pixel comprising n sub-pixels, each of the sub-pixels comprising:
      a switching element;
      a nonvolatile memory element; and
      a pixel electrode,
   wherein:
   n lines of the source signal lines are corresponding to one pixel column;
   an input terminal of the switching element is electrically connected to corresponding one of the n lines of source signal lines;
   an output terminal of the switching element is electrically connected to the pixel electrode;
   the nonvolatile memory element is electrically connected between the pixel electrode and the common electrode;
   a control terminal of the switching element is electrically connected to the gate signal line; and
   each switching element in the pixel is electrically connected to corresponding one of the n lines of the source signal lines.

5. A display device comprising:
   a source signal line;
   a plurality of gate signal lines;
   a common electrode; and
   a pixel comprising a plurality of sub-pixels, each of the sub-pixel comprising:
      a switching element;
      a nonvolatile memory element; and
      a pixel electrode,
   wherein:
   an input terminal of the switching element is electrically connected to the source signal line;
   an output terminal of the switching element is electrically connected to the pixel electrode;
   the nonvolatile memory element is electrically connected between the pixel electrode and the common electrode;
   a control terminal of the switching element is electrically connected to corresponding one of the plurality of gate signal lines; and
   each switching element in the pixel is electrically connected to different one of the plurality of gate signal lines.

6. A display device comprising:
   a source signal line;
   n lines of gate signal lines;
   a common electrode; and
   a pixel comprising n sub-pixels, each sub-pixels comprising:
      a switching element;
      a nonvolatile memory element; and
      a pixel electrode,
   wherein:
   n lines of the gate signal lines are corresponding to one pixel row;
   an input terminal of the switching element is electrically connected to the source signal line;
   an output terminal of the switching element is electrically connected to the pixel electrode;

the nonvolatile memory element is electrically connected between the pixel electrode and the common electrode;
a control terminal of the switching element is electrically connected to corresponding one of the n lines of gate signal lines; and
each switching element in the pixel is electrically connected to corresponding one of the n lines of the gate signal lines.

7. A display device comprising:
a source signal line;
a gate signal line;
a common electrode; and
a pixel comprising:
  a switching element;
  a nonvolatile memory element;
  a driver element; and
  a pixel electrode,
wherein:
an input terminal of the switching element is electrically connected to the source signal line;
an output terminal of the switching element is electrically connected to the driver element;
the nonvolatile memory element is electrically connected between the pixel electrode and the common electrode;
a control terminal of the switching element is electrically connected to the gate signal line; and
the driver element is electrically connected to the pixel electrode.

8. A display device comprising:
a source signal line;
a gate signal line;
a common electrode; and
a pixel comprising a plurality of sub-pixels, each of the sub-pixels comprising:
  a switching element;
  a nonvolatile memory element; and
  a driver element; and a pixel electrode,
wherein:
an input terminal of the switching element is electrically connected to the source signal line,
an output terminal of the switching element is electrically connected to the driver element;
the nonvolatile memory element is electrically connected between the pixel electrode and the common electrode;
a control terminal of the switching element is electrically connected to the gate signal line; and
the driver element is electrically connected to the pixel electrode.

9. A display device comprising:
a plurality of source signal lines;
a gate signal line;
a common electrode; and
a pixel comprising a plurality of sub-pixels, each of the sub-pixels comprising:
  a switching element
  a nonvolatile memory element;
  a driver element; and
  a pixel electrode,
wherein:
an input terminal of the switching element is electrically connected to corresponding one of the plurality of source signal lines;
an output terminal of the switching element is electrically connected to the driver element;
the nonvolatile memory element is electrically connected between the pixel electrode and the common electrode;
a control terminal of the switching element is electrically connected to the gate signal line;
the driver element is electrically connected to the pixel electrode; and
each switching element in the pixel is electrically connected to different one of the plurality of source signal lines.

10. A display device comprising:
n lines of source signal lines;
a gate signal line;
a common electrode; and
a pixel comprising n sub-pixels, each of the sub-pixels comprising:
  a switching element;
  a nonvolatile memory element;
  a driver element; and
  a pixel electrode;
wherein:
n lines of the source signal lines are corresponding to one pixel column
an input terminal of the switching element is electrically connected to corresponding one of the n lines of source signal lines;
an output terminal of the switching element is electrically connected to the driver element;
the nonvolatile memory element is electrically connected between the pixel electrode and the common electrode;
a control terminal of the switching element is electrically connected to the gate signal line;
the driver element is electrically connected to the pixel electrode; and
each switching element in the pixel is electrically connected to corresponding one of the n lines of the gate signal lines.

11. A display device comprising:
a source signal line;
a plurality of gate signal lines;
a common electrode; and
a pixel comprising a plurality of sub-pixels, each of the sub-pixels comprising:
  a switching element;
  a nonvolatile memory element;
  a driver element; and
  a pixel electrode,
wherein:
an input terminal of the switching element is electrically connected to the source signal line;
an output terminal of the switching element is electrically connected to the driver element;
the nonvolatile memory element is electrically connected between the pixel electrode and the common electrode;
a control terminal of the switching element is electrically connected to corresponding one of the plurality of gate signal lines;
the driver element is electrically connected to the pixel electrode; and
each switching element in the pixel is electrically connected to different one of the plurality of gate signal lines.

12. A display device comprising:
a source signal line;
n lines of gate signal lines;
a common electrode; and
a pixel comprising n sub-pixels, each of the sub-pixels comprising:
  a switching element;

a nonvolatile memory element; a driver element; and
a pixel electrode,
wherein:
n lines of the gate signal lines are corresponding to one pixel row;
an input terminal of the switching element is electrically connected to the source signal line;
an output terminal of the switching element is electrically connected to driver element;
the nonvolatile memory element is electrically connected between the pixel electrode and the common electrode;
a control terminal of the switching element is electrically connected to corresponding one of the n lines of gate signal lines;
the driver element is electrically connected to the pixel electrode; and
each switching element in the pixel is electrically connected to any one of the n lines of the gate signal lines.

13. A display device according to any one of claims 1 to 12, wherein a ferroelectric memory is utilized as the nonvolatile memory element.

14. A display device according to any one of claims 1 to 12, wherein a thin film transistor is utilized as the switching element.

15. A display device according to any one of claims 1 to 12, wherein the source signal line driver circuit is formed on the same substrate as the pixel.

16. A display device according to claim 15, wherein the source signal line driver circuit or the gate signal line driver circuit is configured with unipolar transistors.

17. A display device according to any one of claims 1 to 12, wherein the gate signal line driver circuit is formed on the same substrate as the pixel.

18. A display device according to claim 17, wherein the source signal line driver circuit or the gate signal line driver circuit is configured with unipolar transistors.

19. Electric apparatuses, wherein the display device as set forth in any one of claims 1 to 12 is applied.

20. A display device comprising:
a source signal line;
a gate signal line; and
a pixel comprising:
    a first switching element;
    a second switching element;
    a capacitor element;
    a nonvolatile memory element; and
    a pixel electrode,
wherein:
an input terminal of the first switching element is electrically connected to the source signal line;
an output terminal of the first switching element is electrically connected to an input terminal of the second switching element and the pixel electrode;
a control terminal of the first switching element is electrically connected to the gate signal line;
the second switching element is selectively connected to one of the capacitor element and the nonvolatile memory element.

* * * * *